(12) United States Patent
Warnes

(10) Patent No.: US 12,143,013 B2
(45) Date of Patent: Nov. 12, 2024

(54) POWER SUPPLY OUTPUT DEVICE

(71) Applicant: Murata Manufacturing Co., Ltd., Nagaokakyo (JP)

(72) Inventor: Frank Warnes, Milton Keynes (GB)

(73) Assignee: MURATA MANUFACTURING CO., LTD., Kyoto (JP)

( * ) Notice: Subject to any disclaimer, the term of this patent is extended or adjusted under 35 U.S.C. 154(b) by 260 days.

(21) Appl. No.: 17/585,065

(22) Filed: Jan. 26, 2022

(65) Prior Publication Data

US 2022/0149735 A1    May 12, 2022

Related U.S. Application Data

(63) Continuation of application No. PCT/GB2020/051768, filed on Jul. 23, 2020.

(30) Foreign Application Priority Data

Jul. 31, 2019   (GB) ..................... 1910932

(51) Int. Cl.
| | |
|---|---|
| *H02M 1/08* | (2006.01) |
| *H02M 3/158* | (2006.01) |
| *H03K 17/082* | (2006.01) |
| *H03K 17/16* | (2006.01) |

(52) U.S. Cl.
CPC ............ *H02M 3/158* (2013.01); *H02M 1/08* (2013.01); *H03K 17/0828* (2013.01); *H03K 17/168* (2013.01); *H03K 2217/0081* (2013.01)

(58) Field of Classification Search
CPC ....... H03K 2217/0081; H03K 17/0828; H03K 17/168; H02M 1/08; H02M 3/158
See application file for complete search history.

(56) References Cited

U.S. PATENT DOCUMENTS

| | | | | |
|---|---|---|---|---|
| 5,455,758 | A | * 10/1995 | Pelly | ............ H02M 3/33571 363/47 |
| 2008/0123382 | A1 | 5/2008 | Matsushita | |
| 2012/0206169 | A1* | 8/2012 | Kimura | ............ H03K 17/08122 327/109 |

(Continued)

FOREIGN PATENT DOCUMENTS

| | | | |
|---|---|---|---|
| CN | 108649941 A | * 10/2018 | ........... H03K 17/687 |
| EP | 2 797 233 A2 | 10/2014 | |
| WO | 2019/030516 A1 | 2/2019 | |

OTHER PUBLICATIONS

Official Communication issued in International Patent Application No. PCT/GB2020/051768, mailed on Oct. 26, 2020.

*Primary Examiner* — Harry R Behm
(74) *Attorney, Agent, or Firm* — Keating & Bennett, LLP

(57) ABSTRACT

A power supply output device converts an input from a DC-DC converter into a bipolar voltage output of a gate driver circuit driving a power switch. The power output supply device includes an adjusting circuit to measure an output of the gate driver circuit at the gate of the power switch, and to adjust the bipolar voltage output in order to maintain the output of the gate driver circuit at a predetermined voltage. The power supply output device provides a cost-effective technique to regulate the peak positive voltage input into the gate of the power switch at a required voltage, regardless of any fluctuations or losses.

25 Claims, 20 Drawing Sheets

(56) References Cited

U.S. PATENT DOCUMENTS

2015/0236498 A1\* 8/2015 Davidson .............. H03K 17/74
　　　　　　　　　　　　　　　　　　　　　361/57
2016/0056704 A1\* 2/2016 Deboy .............. H02M 3/33523
　　　　　　　　　　　　　　　　　　　　　363/21.13

\* cited by examiner

POWER SUPPLY OUTPUT DEVICE

CROSS REFERENCE TO RELATED APPLICATIONS

This application claims the benefit of priority to GB Patent Application No. 1910932.1 filed on Jul. 31, 2019 and is a Continuation Application of PCT Application No. PCT/GB2020/051768 filed on Jul. 23, 2020. The entire contents of each application are hereby incorporated herein by reference.

BACKGROUND OF THE INVENTION

1. Field of the Invention

This application relates to power supply output devices, and in particular to power supply output devices suitable for use in bipolar gate drive applications.

2. Description of the Related Art

The gate drive voltage requirements of power switches, including but not limited to Insulated-gate bipolar transistors (IGBT), Silicon Carbide MOSFETs (SIC) and standard Silicon MOSFETs (MOS), are varied and numerous, especially with the newer emerging technologies such as SIC and Gallium Nitride (GaN) technologies. Increasingly in fields with power switch gate drive applications, such as those in motor drives, inverters, uninterruptible power sources (UPS), solar power, electric vehicles, and so on, an accurate positive and negative (bipolar) voltage is required of a supply voltage, typically 9 V, 12 V, or 25 V. One problem specific with GaN switches is the need for strict accuracy of the positive voltage at the gate terminal of the GaN switch. Generally, this requires a more expensive DC-DC converter with good regulation.

FIG. 1 shows a typical configuration of a gate drive system 100 of the prior art that drives the gate terminal of a power switch. In FIG. 1, a DC-DC converter 102 provides a voltage supply to an output circuitry 104. The output circuitry 104 could be a built-in component of the DC-DC converter 102, or could be a separate unit. The output circuitry 104 outputs a bipolar voltage, including voltages +V gate and −V gate, to a gate driver circuit 106. The gate driver circuit 106 outputs a signal V gate to drive the gate terminal of a power switch 108. The power switch 108 may be an IGBT, SIC, MOS, GaN, or the like. The power switch 108 is connected by an output return line 110 to the output circuitry 104.

FIG. 2A shows the configuration of the gate drive system 100 of FIG. 1 in more detail. In the gate drive system 100 of FIG. 2A, the DC-DC converter 102 supplies a voltage to the output circuitry 104. This voltage supplies from the DC-DC converter 102 is an isolated voltage. The exact topology is not important. It could be a push pull, flyback, or forward converter, for example. In FIG. 2A the DC-DC converter 102 supplies a voltage of 9 V as an example. An example of the circuitry of the output circuitry 104 is shown in FIG. 2A, and will be discussed further in FIG. 2B. The output circuitry 104 outputs a bipolar voltage, including voltages +V gate and −V gate, to the gate driver circuit 106. The voltages +V gate and −V gate of bipolar voltage are not necessarily equal in magnitude. The voltages +V gate and −V gate may, for example, be +6 V and −3 V, respectively. The gate driver circuit 106 outputs to the gate terminal of a power switch 108 a signal V gate alternating between the voltages +V gate and −V gate as a Pulse Width Modulation (PWM) signal. An example of a possible circuit for the gate driver circuit 106 is shown. An IGBT is shown in FIG. 2A as an example of the power switch 108. The source or emitter terminal of the power switch 108 is connected to the output circuitry 104, via the output return line 110. If the output circuitry 104 is a built-in component of the DC-DC converter 102, the DC-DC converter includes a connection point of the output return line 110, as well as two connection points of the gate driver circuit 106 to connect to the output voltages +V gate and −V gate.

A simple and inexpensive way to achieve the bipolar gate voltages +V gate and −V gate is to use an output circuitry 104 include a resistor and Zener diode connected in series, each with a parallel capacitor. One such output circuitry 104 is shown in FIG. 2B.

FIG. 2B shows a typical configuration of an output circuitry 14 of the prior art. The output circuitry 104 includes a first capacitor 152 in parallel with a resistor 154, and in series with a second capacitor 156. The second capacitor 156 is in parallel with a Zener diode 158. The first capacitor 152 and the resistor 154 are connected to an upper power rail 160, and the second capacitor 156 and the anode of the Zener diode 158 are connected to a lower power rail 170. The center divider point 180 is positioned between the resistor 154 and the Zener diode 158, and is connected to ground in this example. When the output circuitry 104 is used in the gate drive system 100 of FIG. 2A, the output return line 110 is connected to the center divider point 180 of the output circuitry 104, the voltage supplied by the DC-DC converter is supplied between the upper and lower power rails 160, 170, and the gate driver circuit is connected to the upper and lower power rails 160, 170.

In most applications, the first capacitor 152 and second capacitor 156 are equal in capacitance. That is, when using the output circuitry 104 in the gate drive system of FIG. 2A, the voltage across each capacitor will be half the supply voltage at start up. The resistor 154 and Zener diode 158 will then shunt current from one capacitor to the other in order to set the required gate voltages +V gate and −V gate at the respective +V gate and −V gate terminals. At start up, the second capacitor 156 discharges rapidly through the Zener diode 158 as the Zener diode 158 is above its breakdown voltage. This causes the voltage across second capacitor 156 to decrease, therefore increasing the voltage across the first capacitor 152. When the voltage across the second capacitor 156 becomes equal to the Zener breakdown voltage of the Zener diode 158, the circuit is balanced with the voltage −V gate clamped at the Zener breakdown voltage.

Alternatively, an output circuitry such as in FIG. 2C could be used. The output circuitry 104 of FIG. 2C is similar to the output circuitry 104 of FIG. 2B, except that the positions of the Zener diode and the resistor are swapped. In other words, in the output circuitry 104 of FIG. 2C, the first capacitor 152 is in parallel with a Zener diode 194 and the second capacitor 156 is in parallel with a resistor 198. The first capacitor 152 and the cathode of the Zener diode 194 are connected to the upper power rail 160, and the second capacitor 156 and the resistor 198 are connected to the lower power rail 170.

The output circuitry 104 of FIG. 2C operates in a similar way to the output circuitry 104 of FIG. 2B, except that at start up, the Zener diode 194 is below its breakdown voltage; therefore, no current flows through the Zener diode 194, discharging the second capacitor 156 through the resistor 198, increasing the voltage across the first capacitor 152. When the voltage across the first capacitor 152 becomes equal to the Zener breakdown voltage of the Zener diode 194, current is allowed through the Zener diode 194, and the circuit is balanced with the voltage +V gate clamped at the Zener breakdown voltage.

Another example of a gate drive system of the prior art is shown in FIG. 3. In this gate drive system 200, a gate driver circuit 106 is again used to drive the gate terminal of a power switch 108, similar to FIG. 2A. However, instead of the DC-DC converter and output circuitry configuration of FIG. 2A, a flyback DC-DC converter 202 is used to supply the bipolar output voltage to the gate driver circuit 106 in FIG. 3. The flyback converter uses a multicoil transformer to produce voltages +V gate and −V gate as two separate outputs, with respect to the output return line 110. Although a flyback DC-DC converter has been used as an example in FIG. 3, any isolated topology DC-DC converter that produces two separate outputs can be used.

FIG. 4 shows a disadvantage of both the system of FIG. 2A with either output circuitry alternative, and the system of FIG. 3. FIG. 4 is a graph showing the signal V gate output to the gate terminal of the power switch 108 by the gate driver circuit 106. In this example, the output circuitry 104 or the flyback converter 202 are set to produce the voltages +V gate and −V gate at +6 V and −3 V respectively, so as to provide the signal V gate between exactly +6 V and −3 V to the gate of the power switch 108. However, due to voltage drops in the gate driver circuit 106 of, for example, about 1 V, the voltage at the gate of the power switch 108 is only about +5.5 V and −2.5 V. GaN devices require +6 V±0.25 V and −3 V±1 V, so the voltage at the gate of the power switch 108 is outside the limit in this example.

Furthermore, for the system of FIG. 3 and the system of FIG. 2A using the output circuitry 104 of FIG. 2B, if the DC-DC converter 102 or flyback converter 202 were a non-regulated supply with, for example, a ±10% variation on the input supply, it would be difficult to keep the voltage input to the gate of the power switch 108 within the specified requirements. This is true even if the output was increased to compensate for the gate driver circuit 106 voltage drop.

Previous attempts to achieve tight accuracy of the positive gate voltage include using a tightly regulated DC-DC converter to compensate for input changes, or connecting an unregulated DC-DC converter to a tightly regulated input supply. Both of these solutions are expensive. Further attempts include measuring or estimating the voltage drop in the gate driver circuit, and adding extra voltage to the gate drive DC-DC converter output to compensate. However, this cannot be done for all gate drive circuits. Another solution involves adding a linear regulator to the input or output of the DC-DC converter. Again, this adds complexity and therefore cost.

The inventors of the present application discovered the desirability of providing a solution to the problems discussed above.

SUMMARY OF THE INVENTION

The preferred embodiments of the present invention provide methods to regulate the gate voltage by sensing directly from the gate of a power switch, allowing not only the use of a low-cost unregulated DC-DC converter, but also compensating voltage drops in the gate driver integrated circuit. The preferred embodiments of the present invention also provide power supply output devices that allow the peak positive voltage input into a power switch to be regulated at the required voltage. The power supply output devices are able to keep the peak positive voltage of the signal V gate at the desired, correct voltage, even when there are losses or fluctuations in the gate driver circuit. Furthermore, the power supply output devices are able to keep the peak positive voltage of the signal V gate at the desired, correct voltage when there are fluctuations in the power supply. The power supply output devices provide an inexpensive solution to the problems presented by the prior art.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention relate to power supply output devices. The power supply output devices each convert an input from a DC-DC converter into a bipolar voltage output of a gate driver circuit driving a power switch. The power output supply devices each include a circuit that measures the output of the gate driver circuit at the gate of the power switch, and adjusts the bipolar voltage output in order to maintain the output of the gate driver circuit at a predetermined voltage. The power supply output devices provide a cost-effective technique to regulate the peak positive voltage input into the gate of the power switch at a required voltage, regardless of any fluctuations or losses.

First Preferred Embodiment of the Present Invention

Figure 5:
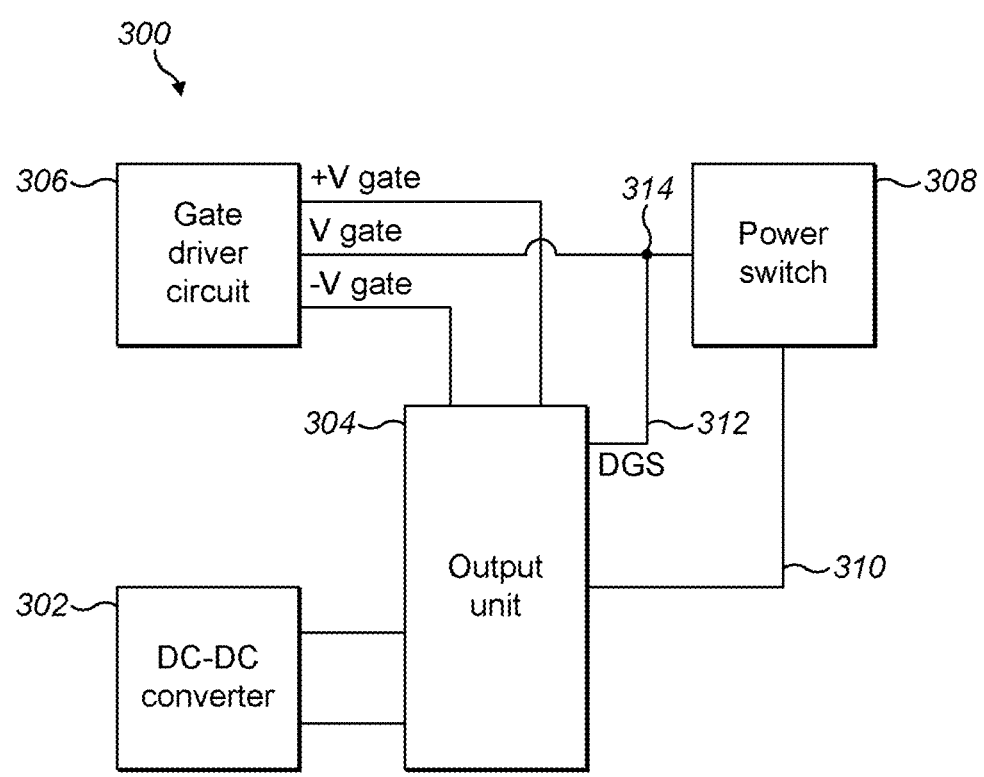
FIG. 5 shows a configuration of a gate drive system of the first preferred embodiment of the present invention.

FIG. 5 shows an example of a configuration of a gate drive system of the first preferred embodiment. In the gate drive system 300 of FIG. 5 a DC-DC converter 302 provides a voltage supply to an output circuitry 304. This voltage supplied from the DC-DC converter 302 is an isolated voltage. The exact topology is not important. It could be a push pull, flyback, or forward converter, for example. The output circuitry 304 could be a built-in component of the DC-DC converter 302, or could be a separate unit. The output circuitry 304 outputs a bipolar voltage, including voltages +V gate and −V gate, to a gate driver circuit 306. These voltages are not necessarily equal in magnitude. For example, for a 9-V supply from the DC-DC converter, the voltages +V gate and −V gate may be +6 V and −3 V, respectively, with respect to the output return line voltage. The gate driver circuit drives the gate terminal of a power switch 308. The gate driver circuit 304 outputs to the gate terminal of a power switch 306 a signal V gate, alternating between the voltages +V gate and −V gate, as a Pulse Width Modulation (PWM) signal. The power switch 308 may be an IGBT, SIC, MOS, GaN, or the like. The source or emitter of the power switch 308 is connected by an output return line 310 to the output circuitry 304.

Furthermore, the configuration of the gate drive system 300 of FIG. 5 includes a Direct Gate Sense (DGS) line 312. The DGS line 312 connects the gate terminal 314 of the power switch 308 or the output terminal of the gate driver circuit 306 directly to the output circuitry 304. Therefore, the signal V gate produced by the gate driver circuit 306 and input into the gate terminal of the power switch is also input into the output circuitry 304.

The examples of voltage values of the poles of the bipolar gate voltages herein are given with respect to the voltage of the output return line 310. The output return line is connected to the source or emitter of the power switch 308, and therefore the voltages +V gate and −V gate are given with respect to the voltage of the source or emitter of the power switch 308. The convention used herein is that the output return line is at zero volts. However, the output return line does not have to be at zero volts. Any other convention could be used.

Figure 6:
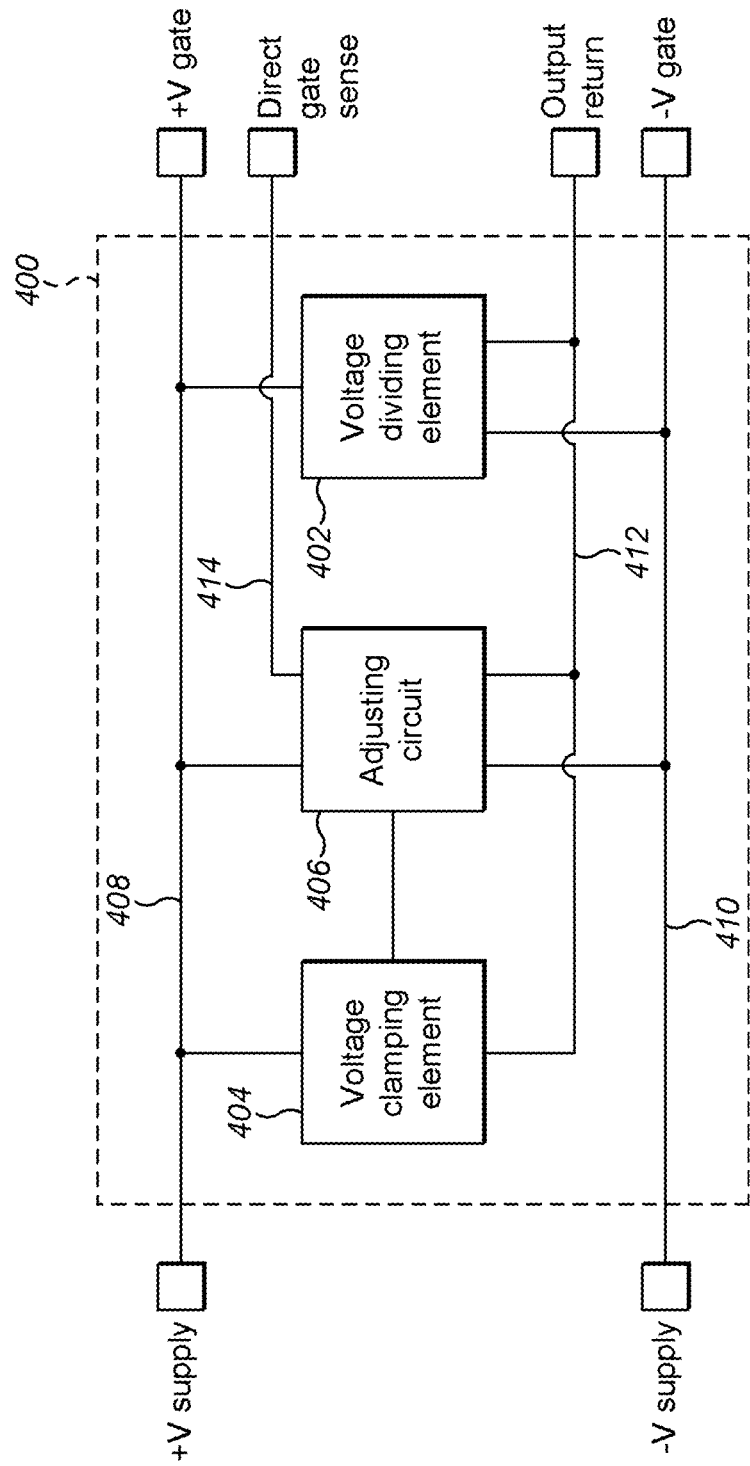
FIG. 6 shows a configuration of a power supply output device of the first preferred embodiment of the present invention.

FIG. 6 shows an example of a power supply output device of the first preferred embodiment, which can be used as the output circuitry 304. The power supply output device 400 includes a voltage divider 402, a voltage clamp 404, and an adjusting circuit 406. The voltage divider 402 is connected between an upper supply rail 408 and a lower supply rail 410. The upper supply rail 408 and lower supply rail 410 can be connected to the output of a DC-DC converter, such as the DC-DC converter 302 of FIG. 5. The voltage divider 402 is also connected to an output return line 412. The adjusting circuit 406 is connected between the upper supply rail 408 and the lower supply rail 410, and is connected to the output return line 412 and a DGS line 414. The voltage clamp 404 is connected between the upper supply rail 408 and the output return line 412, and is also connected to the adjusting circuit 406.

When the power supply output device 400 is used as the output circuitry 304, a voltage is supplied to the power supply output device 400 from the DC-DC converter 302 between the upper supply rail 408 and lower supply rail 410. The gate driver circuit 306 is connected to the upper supply rail 408 and the lower supply rail 410, and uses the output of the power supply output device 400 to produce the signal V gate to be input into the gate terminal 314 of the power switch 308. The output return line 412 of the power supply output device 400 is connected to the source or emitter of the power switch 308, via the output return line 310 of FIG. 5. The DGS line 414 of the power supply output device 400 is connected directly to the output of the gate driver circuit 306 at the gate terminal 314 of the power switch 308, via the DGS line 312 of FIG. 5. If the power supply output device 400 is a built-in component of the DC-DC converter 302, the DC-DC converter includes a connection point of the output return line 310 to connect to the output return line 412 of the power supply output device 400, a connection point of the DGS line 312 to connect to the DGS line 414 of the power supply output device 400, and two connection points of the gate driver circuit 306 to connect to the upper power rail 408 and the lower power rail 410 of the power supply output device 400.

At switch on, the voltage supplied by the DC-DC converter 302 is divided by the voltage divider 402. The voltage clamp 404 then adjusts this divided voltage, and clamps the voltages in order to set the gate voltages +V gate and −V gate at an initial value. For example, for a 9-V supply from the DC-DC converter, the voltages +V gate and −V gate may be initially set at +6 V and −3 V, respectively. In the first preferred embodiment, before a signal is input into the DGS line 514, the power supply output device 500 starts with the positive gate voltage +V gate supply within the specifications of the power switch 308, for example, +6 V. However, the peak positive voltage of the signal V gate is likely to be lower due to losses in the gate driver circuit 306.

When the gate signal V gate produced by the gate driver 306 is input to the DGS line 414, the adjusting circuit 406 measures the actual peak positive voltage at the power switch 308. For example, due to voltage drops in the gate driver circuit 306 of about 1 V, the voltage at the gate terminal 314 of the power switch 308 may only be about +5.5 V as the peak positive voltage, rather than the +6 V output through the voltage +V gate. The voltage clamp 404 is configured to switch off when a signal is input into adjusting circuit 406 via the DGS line 414. The adjusting circuit 406 then adjusts and re-clamps the divided voltage such that an accurate positive peak voltage is at the power switch 308. For example, if the adjusting circuit 406 detects that the power switch 308 only received a peak positive voltage of +5.5 V, then the adjusting circuit 406 will adjust and clamp the divided voltage such that the voltage +V gate is, for example, +6.5 V so that the power switch 308 will be a peak positive voltage of +6 V at the gate terminal 314 after the losses through the gate driver circuit 306.

In the first preferred embodiment, the Direct Sense Gate connection made between the actual power switch gate terminal 314 and the output circuitry 304 allows the power supply output device to sense the signal V gate, and to adjust the positive gate voltage +V gate with respect to the output return voltage so that the peak positive voltage of the signal V gate is always at the desired level, for example, +6 V.

Figure 7:
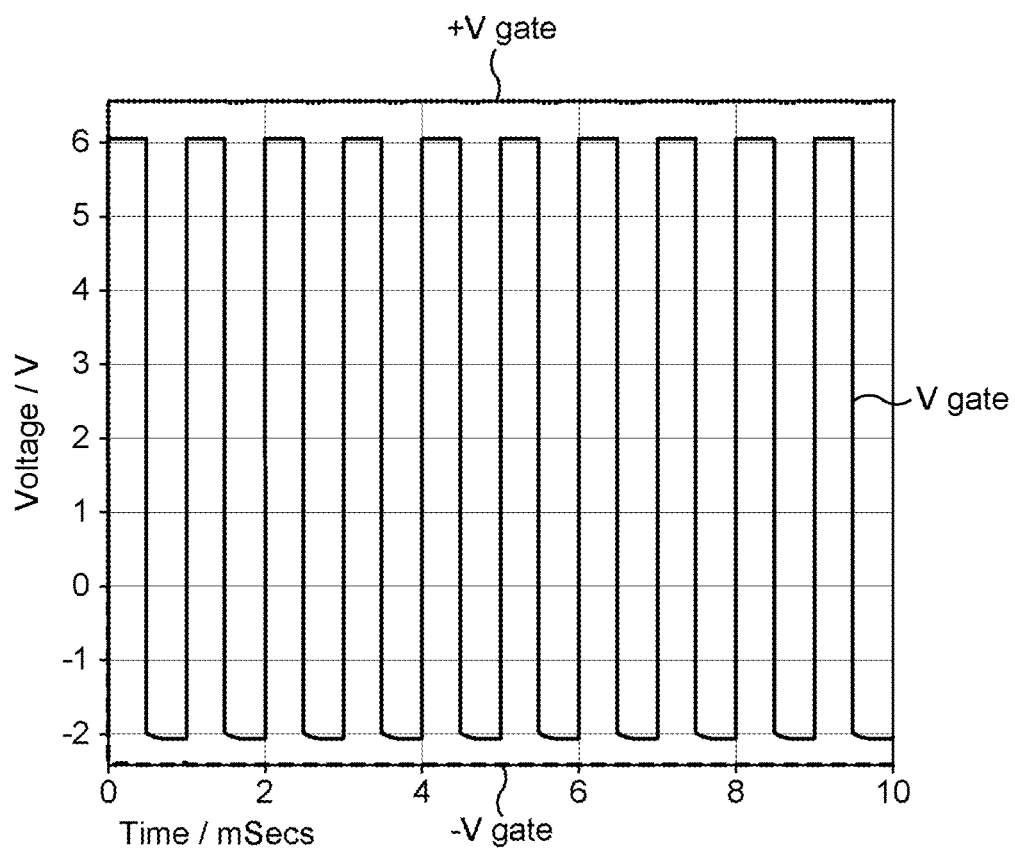
FIG. 7 is a graph showing advantages of the first preferred embodiment of the present invention.

FIG. 7 demonstrates this advantage of the first preferred embodiment. FIG. 7 shows the signal V gate at the power switch 308. The operation of the first preferred embodiment results in a peak positive voltage of +6 V, which is the voltage desired in this example. The voltages +V gate and −V gate are also shown. These have been appropriately set by the adjusting circuit 406 at +6.5 V and −2.5 V, in order to compensate for any losses in the driver circuit, achieving an accurate positive voltage required of power switches such as GaN devices.

The power supply output device 400 would also compensate other effects. For example, the circuit would adjust the output voltages +V gate and −V gate to maintain the positive peak voltage of the signal V gate in the event of random fluctuations or changes in the power supply voltage.

Accurate control of the peak positive voltage of the signal V gate in this way results in the peak negative voltage of the signal V gate becoming reduced, being reduced to about −2.2 V in the example in FIG. 7. However, the peak negative voltage does not have to be as accurate as the peak positive voltage in power switch applications.

Even with a ±10% variation on the input supply voltage, the peak positive voltage of the signal V gate will stay the same. Furthermore, this does not affect the undervoltage and overvoltage lockout sensing often found in gate drive controllers because the 9-V total supply to the controller remains the same, with only the positive and negative gate voltages +V gate and −V gate with respect to the output return (mid-divider) voltage being adjusted.

This preferred embodiment of the present invention could be applied to any power switch gate drive application, including but not limited to, those in motor drives, inverters, uninterruptible power sources (UPS), solar power, electric vehicles, and so on.

Although in this preferred embodiment the adjusting circuit 406 is configured to clamp the positive gate voltage +V gate, the positive and negative sides could be reversed so that the adjusting circuit 406 clamps the negative gate voltage −V gate instead, if accurate control of the negative gate voltage −V gate was desired.

The voltage values used in this preferred embodiment are exemplary only and are not limiting.

Second Preferred Embodiment of the Present Invention

Figure 8:
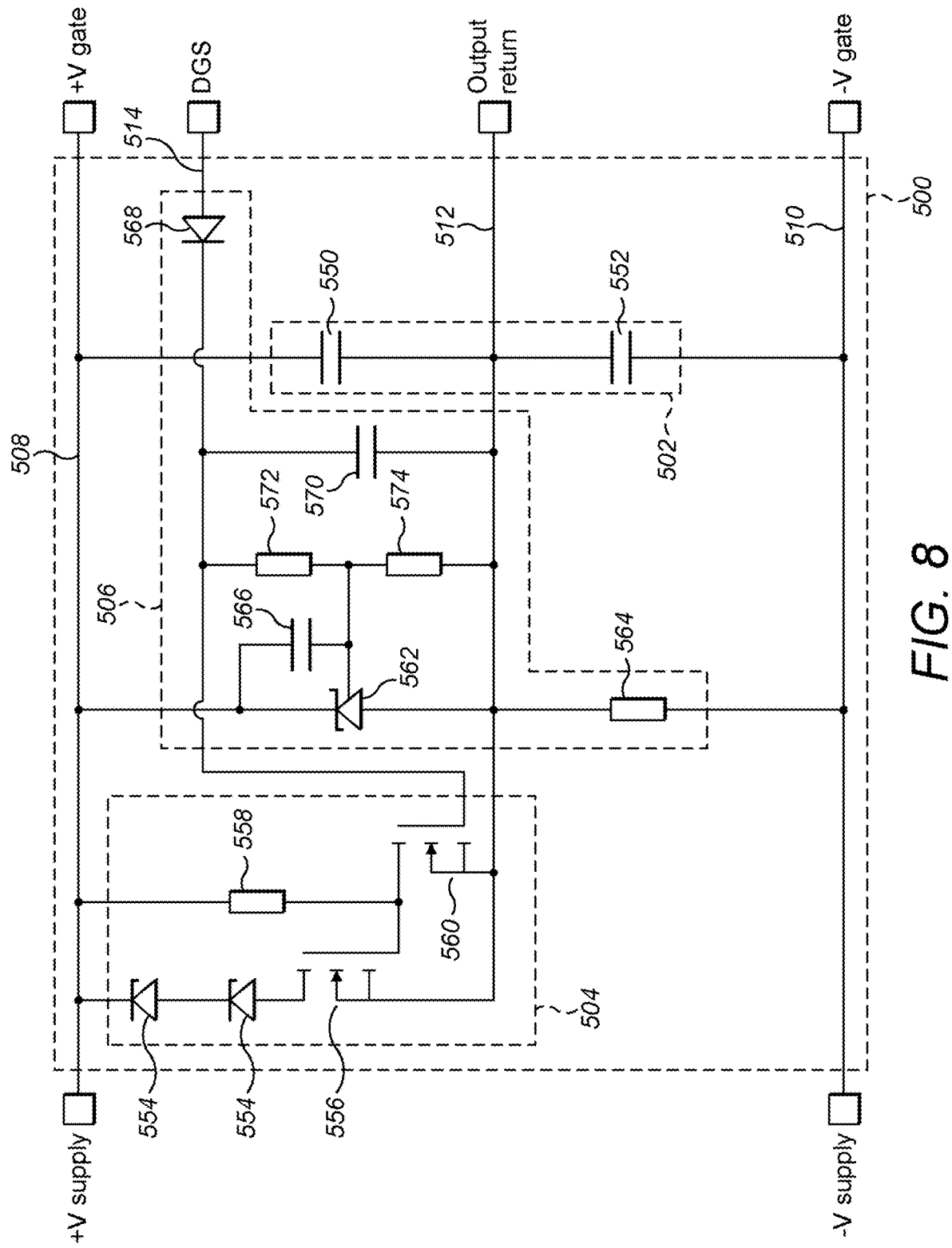
FIG. 8 shows a configuration of a power supply output device of the second preferred embodiment of the present invention.

A power supply output device of the second preferred embodiment is shown in FIG. 8. The power output supply of the second preferred embodiment is a specific example of a power output supply such as in the first preferred embodiment. The power supply output device 500 of FIG. 8 includes a voltage divider 502, a voltage clamp 504 and an adjusting circuit 506. The voltage divider 502 is connected between an upper supply rail 508 and a lower supply rail 510. The upper supply rail 508 and lower supply rail 510 can be connected to the output of a DC-DC converter, such as the DC-DC converter 302 of FIG. 5. The voltage divider 502 is also connected to an output return line 512. The voltage clamp 504 is connected between the upper supply rail 508 and the output return line 512, and is also connected to the adjusting circuit 506. The adjusting circuit 506 is connected between the upper supply rail 508 and the lower supply rail 510, is connected to an output return line 512 and the voltage clamp 504, and is also connected to a DGS line 514.

The voltage divider 502 includes a first capacitor 550 and a second capacitor 552 connected in series between the upper supply rail 508 and the lower supply rail 510. The output return line 512 is connected to the voltage divider 502 between the first capacitor 550 and a second capacitor 552. The first and second capacitors 550, 552 may have different capacitance values, or equal capacitance values. Preferably, the capacitance values of the first and second capacitor 550, 552 are equal for simplicity and cost reduction.

The voltage clamp 504 includes one or more Zener diodes 554 connected in series and in the same direction, a first switch 556, a first resistor 558, and a second switch 560. Each of the first switch 556 and second switch 560 can be a transistor, for example, a bipolar transistor or a field effect transistor such as a MOSFET. N channel MOSFETs have been used as an example in the second preferred embodiment. The one or more Zener diodes 554 in series are connected between the upper supply rail 508 and a drain of the first switch 556. A Zener diode cathode is connected to the upper power supply rail 508 and a Zener diode anode is connected to the drain of the first switch 556. The first resistor 558 is connected between the upper supply rail 508 and the gate of the first switch 556. The gate of the first switch 556 is connected to the drain of the second switch 560. The sources of the first switch 556 and the second switch 560 are connected to the output return line 512. In an alternative preferred embodiment, the one or more Zener diodes 554 could be replaced with one or more reference diodes.

The adjusting circuit 506 includes a reference diode 562 with the cathode connected to the upper supply rail 508 and the anode connected to the output return line 512. A second resistor 564 is connected between the output return line 512 and the lower supply rail 510. A third capacitor 566 is connected between the cathode terminal and the reference terminal of the reference diode 562. The adjusting circuit 506 includes a peak detector 568 which is connected to the DGS line 514. The peak detector 568 may be a peak rectifier, for example a diode, a P channel MOSFET, a Schottky diode, or the like. In the second preferred embodiment, a diode has been used as the peak detector 568. A fourth capacitor 570 is connected between the output of the peak detector 568 and the output return line 512. A third resistor 572 and a fourth resistor 574 in series are also connected between the output of the peak detector 568 and the output return line 512, in parallel with the fourth capacitor 570. The reference terminal of the reference diode 562 is connected to a point in-between the third resistor 572 and the fourth resistor 574. The output of the peak detector 568 is connected to the gate of the second switch 560 of the voltage clamp 504. In an alternative preferred embodiment, rather than peak rectifying the signal from the DGS line 514 and inputting the peak rectified signal into the fourth capacitor 570, a sample and hold circuit could be used. The advantage of a sample and hold circuit is that there would be no voltage drop over a diode such as in the case where a diode is used as the peak detector 568.

The power supply output device 500 of FIG. 8 can be used as the output circuitry 304 in a system configured as in FIG. 5. A voltage is supplied from the DC-DC converter 302 between the upper supply rail 508 and the lower supply rail 510 of the power supply output device 500. This voltage supplied from the DC-DC converter 302 is an isolated voltage. The exact topology is not important, it could be a push pull, flyback, or forward converter, for example. The power supply output device 500 may be built-into the DC-DC converter 302, or may be a separate entity.

The gate driver circuit 306 is connected over the upper and lower supply rails 508, 510 and uses the output of the power supply output device 500 to produce the signal V gate to be input into the gate terminal 314 of the power switch 308. The signal V gate is also input into the DGS line 514 of the power supply output device 500 via the DGS line 312. The source or emitter of the power switch 308 is connected to the output return line 512 of the power supply output device 500 via the output return line 310. If the power supply output device 500 is a built-in component of the DC-DC converter 302, the DC-DC converter includes a connection point of the output return line 110 to connect to the output return line 522 of the power supply output device 500, a connection point of the DGS line 312 to connect to the DGS line 514 of the power supply output device 500, and two connection points of the gate driver circuit 306 to connect to the upper power rail 508 and the lower power rail 510.

In the second preferred embodiment, the peak detector 568 is included within the adjusting circuit 506 of the power supply output device 500. However, in some preferred embodiments, the peak detector 568 could be included in a separate unit positioned between the power supply output device and the DGS line 312.

At switch on, the voltage supplied by the DC-DC converter 302 appears across the voltage divider, +V supply with respect to −V supply in FIG. 8. The voltage divider 502 then divides the voltage between the first capacitor 550 and the second capacitor 552. The first capacitor 550 and second capacitor 552 have equal capacitance so that the voltage is initially split equally between them. For example, if a 9-V supply is used, the voltage drop across each of the capacitors would be 4.5 V.

When no signal is input into the DGS line 514, there is no voltage at the gate of second switch 560, and the second switch 560 remains off. This allows the voltage at the gate terminal of the first switch 556 to rise through the first resistor 558, which is acting as a pull-up resistor. The first switch 556 therefore turns on.

Because the second capacitor 552 and the second resistor 564 are connected in parallel, the second capacitor 552 starts to discharge through the second resistor 564, and therefore the voltage across the first capacitor 550 starts to increase. When the voltage across the first capacitor 550 reaches the total Zener breakdown voltage of the one or more Zener diodes 554, the one or more Zener diodes 554 start to conduct. In the second preferred embodiment, this total Zener breakdown voltage is chosen to be equal to the peak positive voltage required for the power switch 308, for example, +6 V if the required voltage is +6 V. At the point where the one or more Zener diodes conduct, the positive and negative gate voltages reach a balance where, in this case, the voltage +V gate is +6 V with respect to the output return line 512, and the voltage −V gate is −3 V with respect to the output return line 512. The reference diode 562 does not allow any current to flow through the reference diode 562 when there is no signal input into the DGS line 514.

In the second preferred embodiment, before a signal is input into the DGS line 514, the power supply output device 500 starts with the positive gate voltage +V gate supply within the specifications for the power switch 308, for example, +6 V. However, the peak positive voltage of the signal V gate is likely to be lower due to losses in the gate driver circuit 306.

Next, a signal V gate produced by the gate driver circuit 306 is input to the DGS line 514 via the DGS line 312. The pulse waveform of the signal V gate is input into the peak detector 568. As an example, the peak detector 568 in the second preferred embodiment is a diode which peak rectifies the signal V gate. This charges the fourth capacitor 570 to the peak positive value of the signal V gate minus the voltage drop over the peak detector 568. For example, in this case, the peak positive voltage of the signal V gate is +6 V minus the losses in the gate driver circuit, and the voltage drop over the diode of the peak detector 568 is 0.6 V; therefore, the fourth capacitor 570 charges to +5.4 V minus the losses in the gate driver circuit 306. The second switch 560 has a positive voltage at its gate terminal and is therefore turned fully on. This causes the first switch 556 to be turned off, which disconnects the one of more Zener diodes 554 of the voltage clamp 504.

Once the first switch 556 is switched off, the voltage across the first capacitor 550, and therefore the positive gate voltage +V gate, is no longer clamped to the Zener breakdown voltage of the one or more Zener diodes 554. The second capacitor 552 will then shunt current through the second resistor 564, causing the voltage across the first capacitor 550 to increase. This in turn causes an increase in the positive peak voltage of the pulse waveform of the signal V gate, which is input into the peak detector 568 via the DGS line 514. This further charges the fourth capacitor 570. The voltage across the fourth capacitor 570 is sensed by the adjustable reference diode 562 through the potential divider of the third and fourth resistors 572, 574. The resistances of the third and fourth resistors 572, 574 are selected so that when the voltage across the third and fourth resistors 572, 574 reaches the required positive peak voltage of the signal V gate, minus the voltage drop over the peak detector 568, the reference diode 562 starts to shunt current. This clamps the voltage across the first capacitor 550. At this point, the circuit is balanced with the voltage across the first capacitor 550 held at the required positive peak voltage of the signal V gate plus the voltage to compensate for the losses in the gate driver circuit 306.

For example, if +6 V is required as the peak positive voltage of the signal V gate, and the voltage drop over the diode of the peak detector 568 is 0.6 V, then the third and fourth resistors 572, 574 are selected so that the reference diode 562 starts to shunt current when the voltage across the third and fourth resistors 572, 574 reaches +6 V −0.6 V=5.4 V. If only +5.5 V is received via the DGS line 514 at the gate of the power switch 308, the fourth capacitor will charge to +5.5 V −0.6 V=4.9 V, and the reference diode will not shunt current. The first capacitor 550 will charge up until first capacitor 550 reaches +6 V+0.5 V=6.5 V, at which point the voltage across the third and fourth resistors 572, 574 reaches +5.4 V and the reference diode 562 will shunt current. Now, the reference diode 562 is regulating the positive voltage +V gate such that the peak positive voltage of the signal V gate is always +6 V, by sensing the gate of the power switch 308 directly. These voltage values are exemplary only and are not limiting. Various alternatives are possible, for example, if a Schottky diode is used as the peak detector 568, the voltage drop over the peak detector 568 would be lower. In this case, a different selection of third and fourth resistors 572, 574 is needed to make the reference diode 562 shunt current when peak positive voltage of the signal V gate is +6 V.

The third capacitor 566 provides negative feedback to prevent any input noise at the reference terminal of the reference diode 562 from causing rapid fluctuations in the output at the cathode of the reference diode 562.

The power supply output device 500 of the second preferred embodiment allows the peak positive voltage of the signal V gate input into the power switch 108 to be held at the required voltage. The power supply output device 500 is able to keep the peak positive voltage of the signal V gate at the correct voltage even when there are losses or fluctuations in the gate driver circuit 306. Furthermore, the power supply output device 500 is able to keep the peak positive voltage of the signal V gate at the correct voltage when there are fluctuations in the power supply. The power supply output device 500 provides an inexpensive solution to the problems presented by the prior art systems discussed above.

Figure 9A:
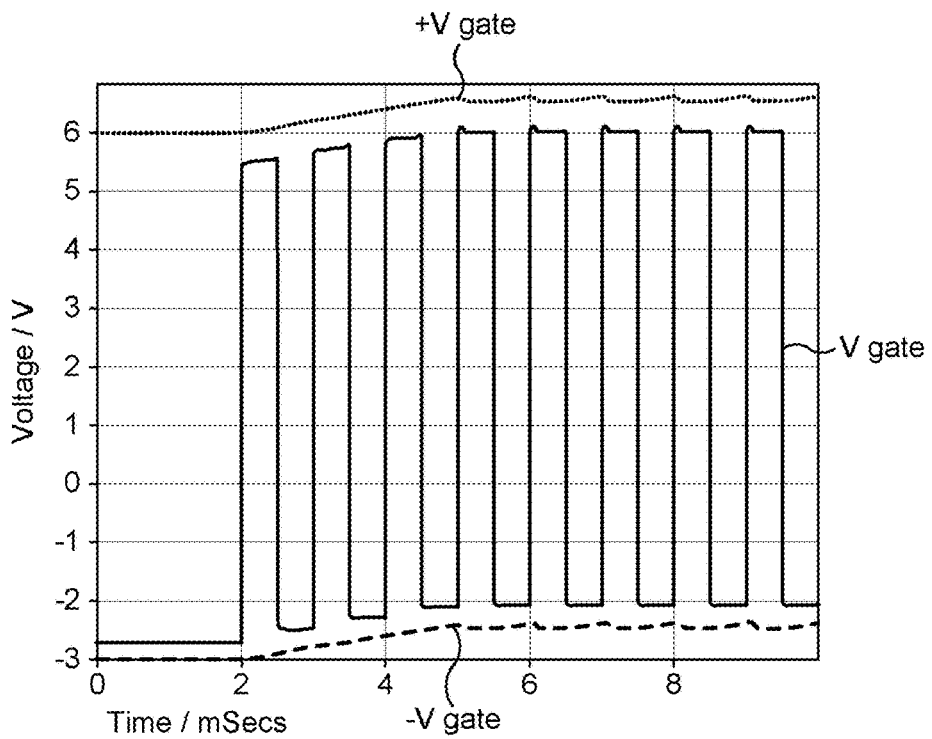
FIG. 9A is a graph showing advantages of the second preferred embodiment of the present invention.
Figure 9B:
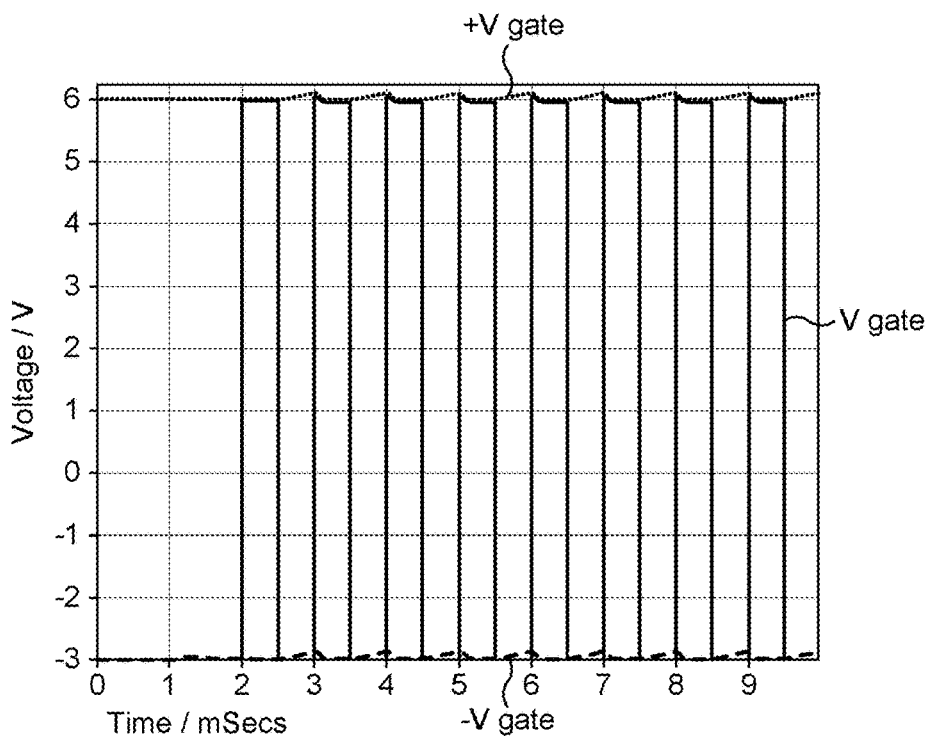
FIG. 9B is a graph showing advantages of the second preferred embodiment of the present invention.

The resulting gate voltage waveform of the signal V gate from the gate driving circuit 306 using the power supply output device 500 is shown in FIGS. 9A and 9B. To produce these graphs a 9-V supply from the DC-DC converter was used, and the components used were first and second capacitors 550, 552 with a 4.7-μF capacitance, two BZX84-3V0 Zener diodes as the one or more Zener diodes 554, two 2N7000 N channel MOSFETs as the first and second switches 556, 560, a 10-kΩ first resistor 558, a TL431 reference diode 562, a 1-kΩ second resistor 564, a 1-nF third capacitor 566, a 31-kΩ third resistor 572, a 25-kΩ fourth resistor 574, a 10-nF fourth capacitor 570, and a BAS70-06 diode as the peak detector 568. Specific components and given values are exemplary only. Various alternatives could be used, as would be understood by those skilled in the art.

FIG. 9A shows the operation of the system when there is a voltage drop of 1 V in the gate driver circuit 306. The voltage clamp 504 holds the voltage +V gate at +6 V initially. At 2 ms, the DGS line 514 is connected to gate of the power switch 308. Initially, the peak positive voltage at the gate of the power switch 308 is only +5.5 V. The power output supply device 500 then increases the voltage +V gate until the peak positive voltage of the signal V gate reaches +6 V as desired in this example. The peak positive voltage of the signal V gate is then kept at +6 V by the circuit, even if there are fluctuations in the power supply or gate driver circuit 306 output.

Accurate control of the peak positive voltage of the signal V gate in this way results in the peak negative voltage of the signal V gate becoming reduced, being reduced to about −2 V in the example in FIG. 9A. However, the peak negative voltage does not have to be as accurate as the peak positive voltage in power switch applications.

Figure 1:
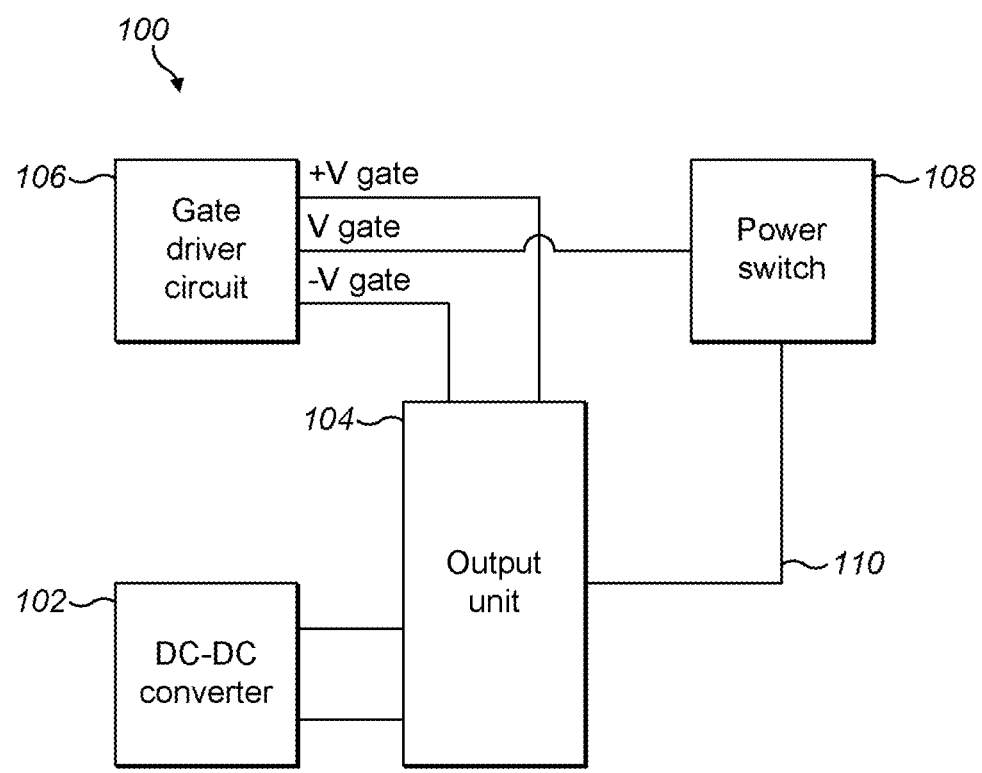
FIG. 1 shows a configuration of a gate drive system of the prior art.
Figure 2A:
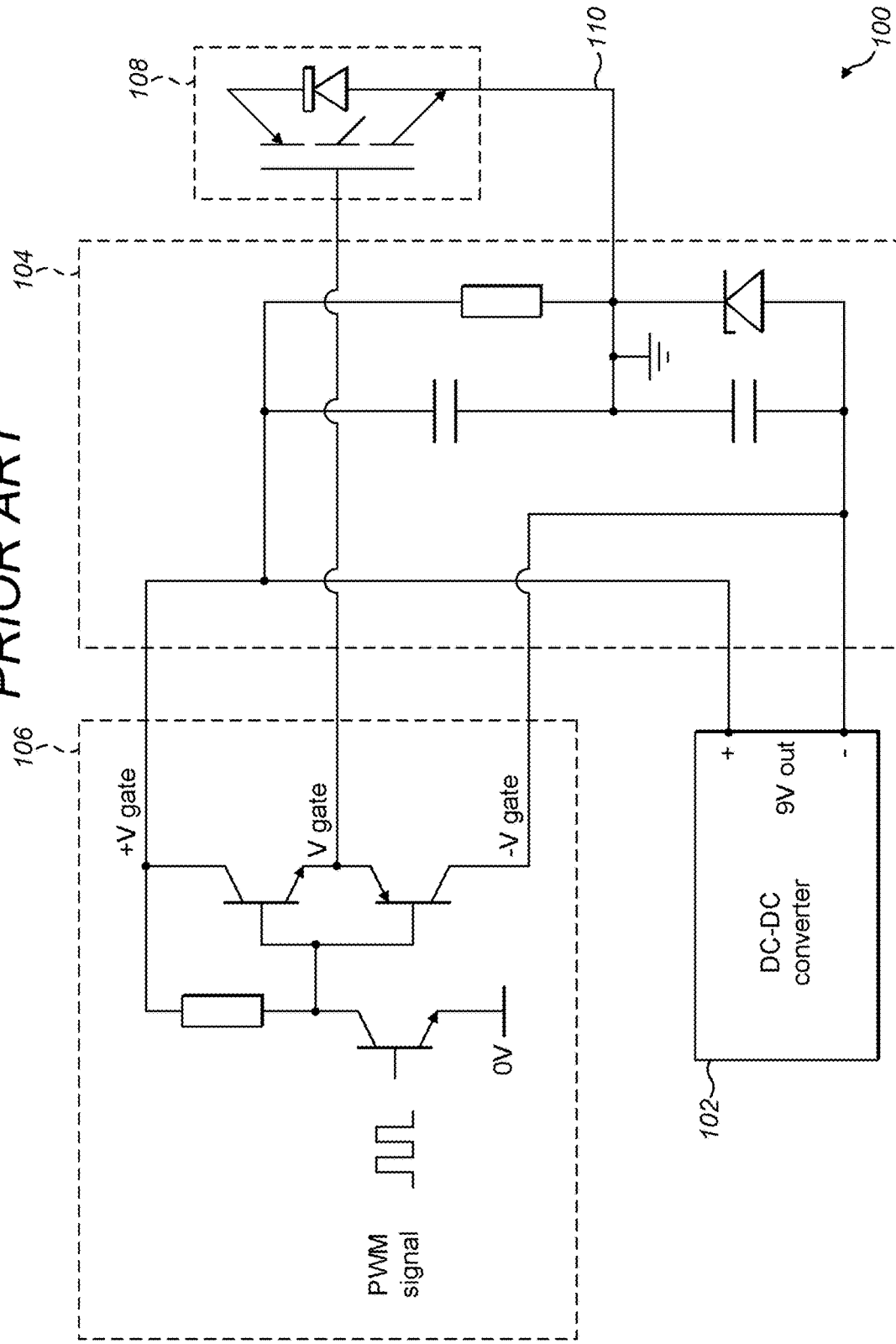
FIG. 2A shows a configuration of a gate drive system of the prior art.
Figure 2B:
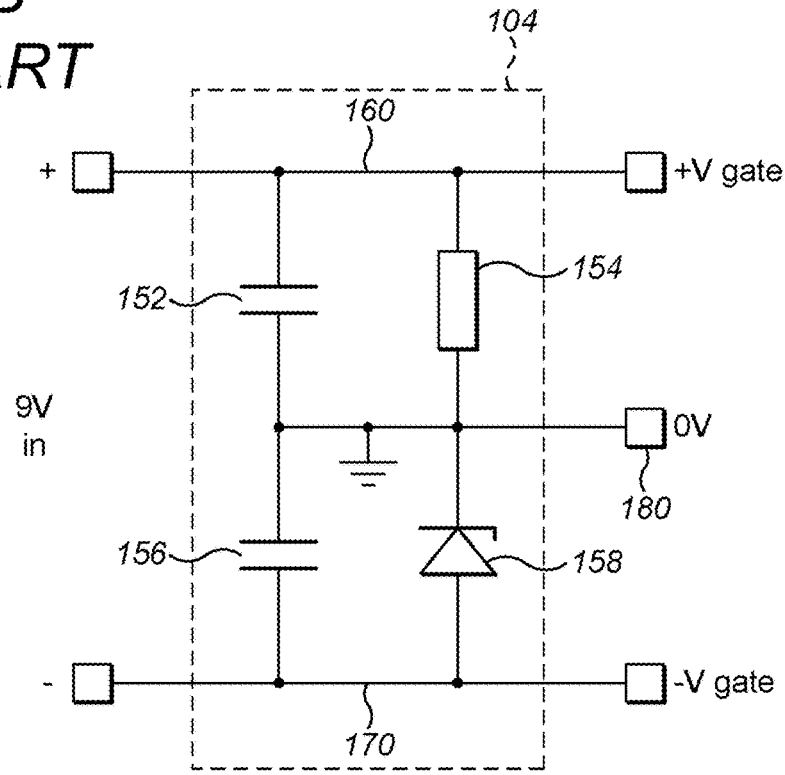
FIG. 2B shows an output circuitry of the prior art.
Figure 2C:
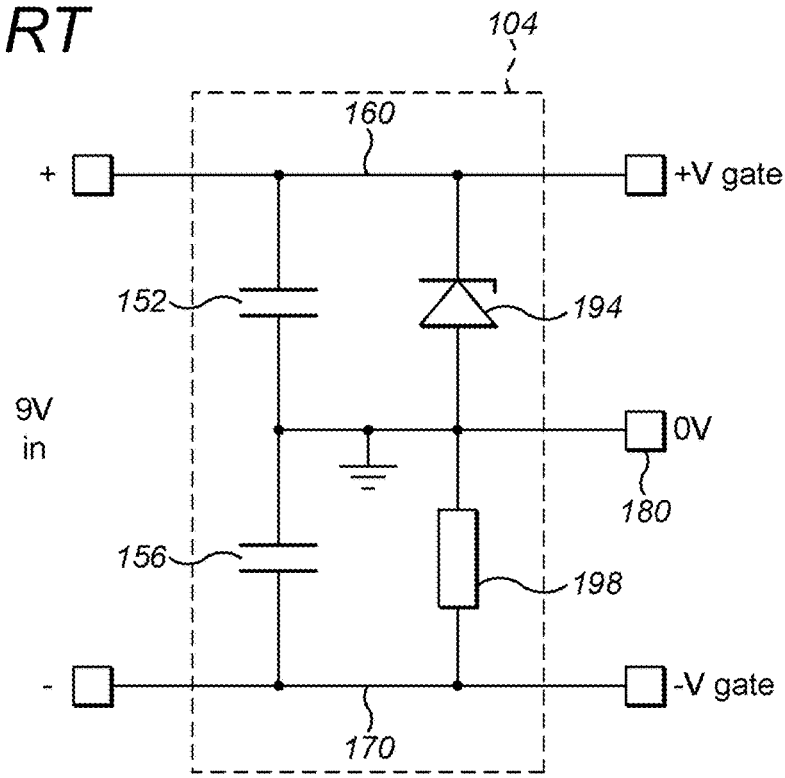
FIG. 2C shows an alternative output circuitry of the prior art.
Figure 3:
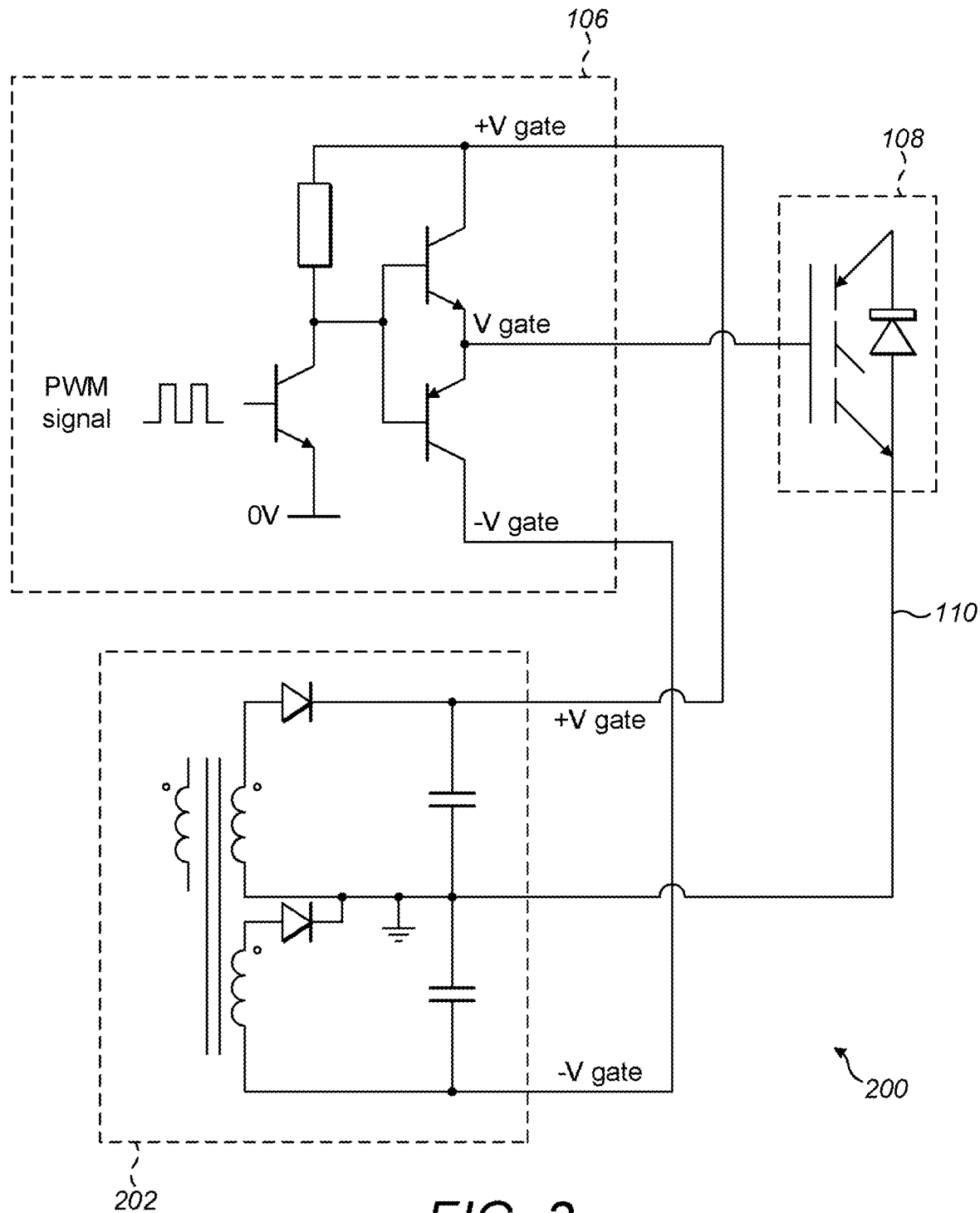
FIG. 3 shows a configuration of a gate drive system of the prior art.
Figure 4:
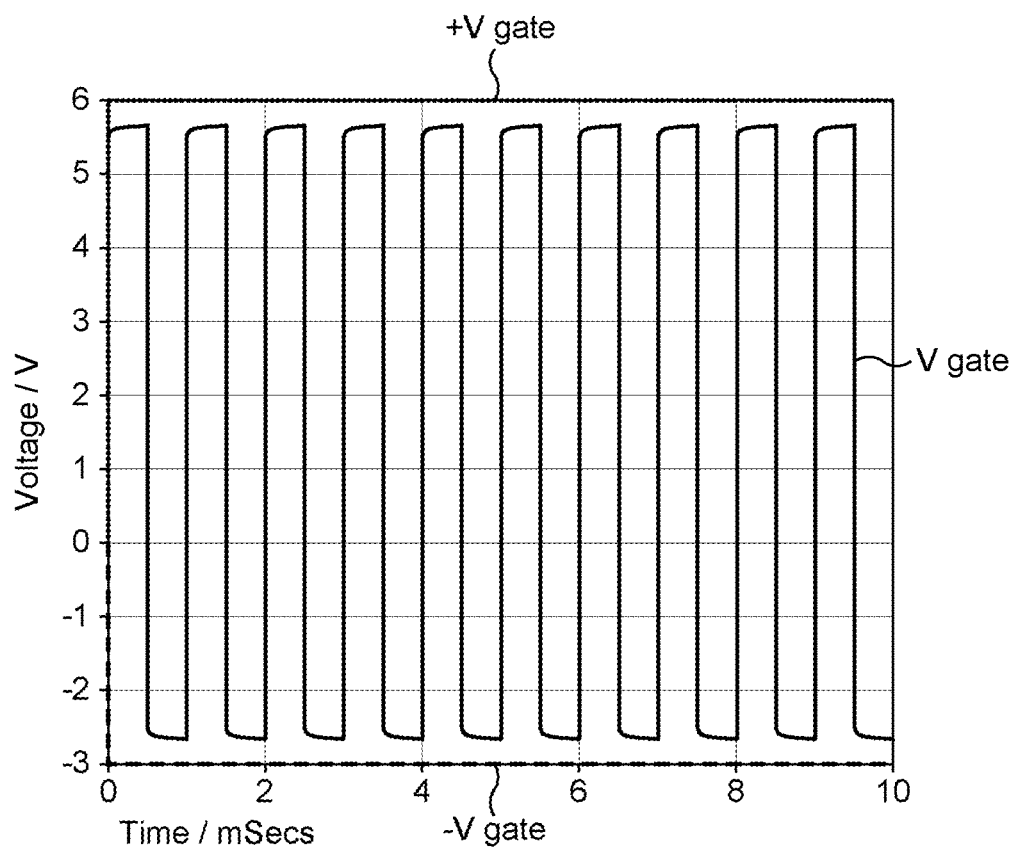
FIG. 4 is a graph showing the disadvantage of gate drive systems such as that in FIGS. 2A and 3.

FIG. 9B is a similar graph to FIG. 9A except that FIG. 9B is the case where there is no voltage loss in the gate driver circuit 306. The voltage clamp 504 holds the voltage +V gate at +6 V initially. When the DGS line 514 is connected to the gate of the power switch 308, and the first switch 556 is switched off, the peak positive voltage of the signal V gate is already at the desired voltage to drive the power switch 308, which in this case +6 V. The reference diode 562 then maintains the voltage +V gate to keep the peak positive voltage of the signal V gate at +6 V. Both of FIGS. 9A and 9B demonstrate the advantage over the output of the prior art systems of FIGS. 2A to 3.

The slight deviations of the peak positive voltage of the signal V gate in FIGS. 9A and 9B are a result of the peak rectification of the signal V gate. The fourth capacitor 570 will only be charged 50% of the time when a 50% duty cycle square wave is used for the PWM signal V gate. This results in the fourth capacitor 570 being charged on average to slightly below the peak positive voltage of the signal V gate minus the voltage drop over the peak detector. This reduction can be compensated by careful selection of the reference diode 562 and third and fourth resistors 572, 574.

This preferred embodiment of the present invention could be applied to any power switch gate drive application, including but not limited to those in motor drives, inverters, uninterruptible power sources (UPS), solar power, electric vehicles, and so on.

Although in this preferred embodiment the positive gate voltage +V gate is regulated, to hold the peak positive voltage of the signal V gate at the required value, the power rails could be reversed so that accurate control of the peak negative voltage of the signal V gate was performed, if accurate control of the peak negative voltage of the signal V gate was desired.

Third Preferred Embodiment of the Present Invention

Figure 10:
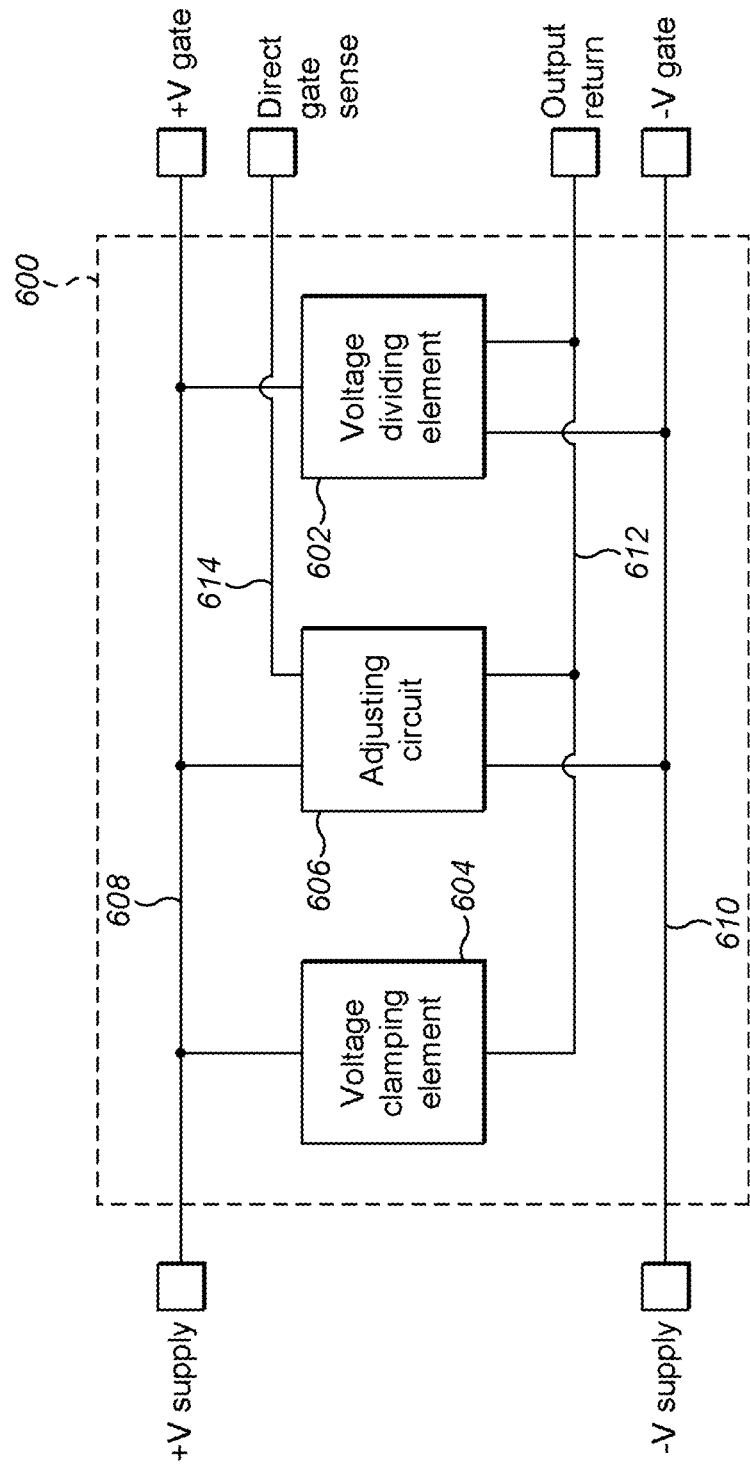
FIG. 10 shows a configuration of a power supply output device of the third preferred embodiment of the present invention.

FIG. 10 shows an example of a configuration of a gate drive system 600 of the third preferred embodiment. The third preferred embodiment is the same as the first preferred embodiment except that the voltage clamp 604 is not connected directly to the adjusting circuit 606, other than via the upper power supply rail 608 and the output return line 612.

Furthermore, the power output supply 600 of the third preferred embodiment differs from the first and second preferred embodiments in that the power supply output device 600 starts, before the signal V gate is input into the DGS line 312, with the positive gate voltage +V gate above the desired voltage of the power switch 308. For example, the power supply output device 600 of the third preferred embodiment would start with a positive gate voltage +V gate of +7 V, for example, if a +6-V voltage was required at the gate of the power switch 308. In the first and second preferred embodiments, when a +6 V peak positive voltage of the signal V gate was required at the gate of the power switch 308, the power supply output device 500 started with the voltage +V gate at the desired voltage, e.g., at +6 V, before the DGS line 514 was connected.

The voltage divider 602 is connected between the upper supply rail 608 and a lower supply rail 610. The voltage divider 402 is also connected to an output return line 412.

In the third preferred embodiment, when the gate signal V gate produced by the gate driver 306 is input to the DGS line 614, the voltage clamp 604 is configured to deactivate. This deactivation does not rely on a direct link to the voltage clamp 604 in addition to the upper power supply rail 608 and the output return line 612, unlike the deactivation in the first preferred embodiment. Instead in the third preferred embodiment, the deactivation of the voltage clamp 604 happens automatically because the voltage set by the voltage clamp 604 is overridden by a lower voltage set by the adjusting circuit 606, as detailed below.

When the gate signal V gate produced by the gate driver 306 is input to the adjusting circuit 606 via the DGS line 614, the adjusting circuit 606 measures the actual peak positive voltage received by the power switch 308. For example, due to voltage drops in the gate driver circuit 306 of about 1 V, the gate of the power switch 308 may only be about +6.5 V as the peak positive voltage of the signal V gate, rather than the +7 V output through the voltage +V gate. The adjusting circuit 606 then adjusts and re-clamps the divided voltage at a lower voltage, such that an accurate positive peak voltage is at the power switch 308. For example, if the adjusting circuit 606 detects that the power switch 308 received a peak positive voltage of +6.5 V, then the adjusting circuit 606 will adjust and clamp the divided voltage such that the voltage +V gate is, for example, +6.5 V rather than +7 V so that the power switch 308 will receive a peak positive voltage of +6 V after the loss through the gate driver circuit 306.

Fourth Preferred Embodiment of the Present Invention

Figure 11:
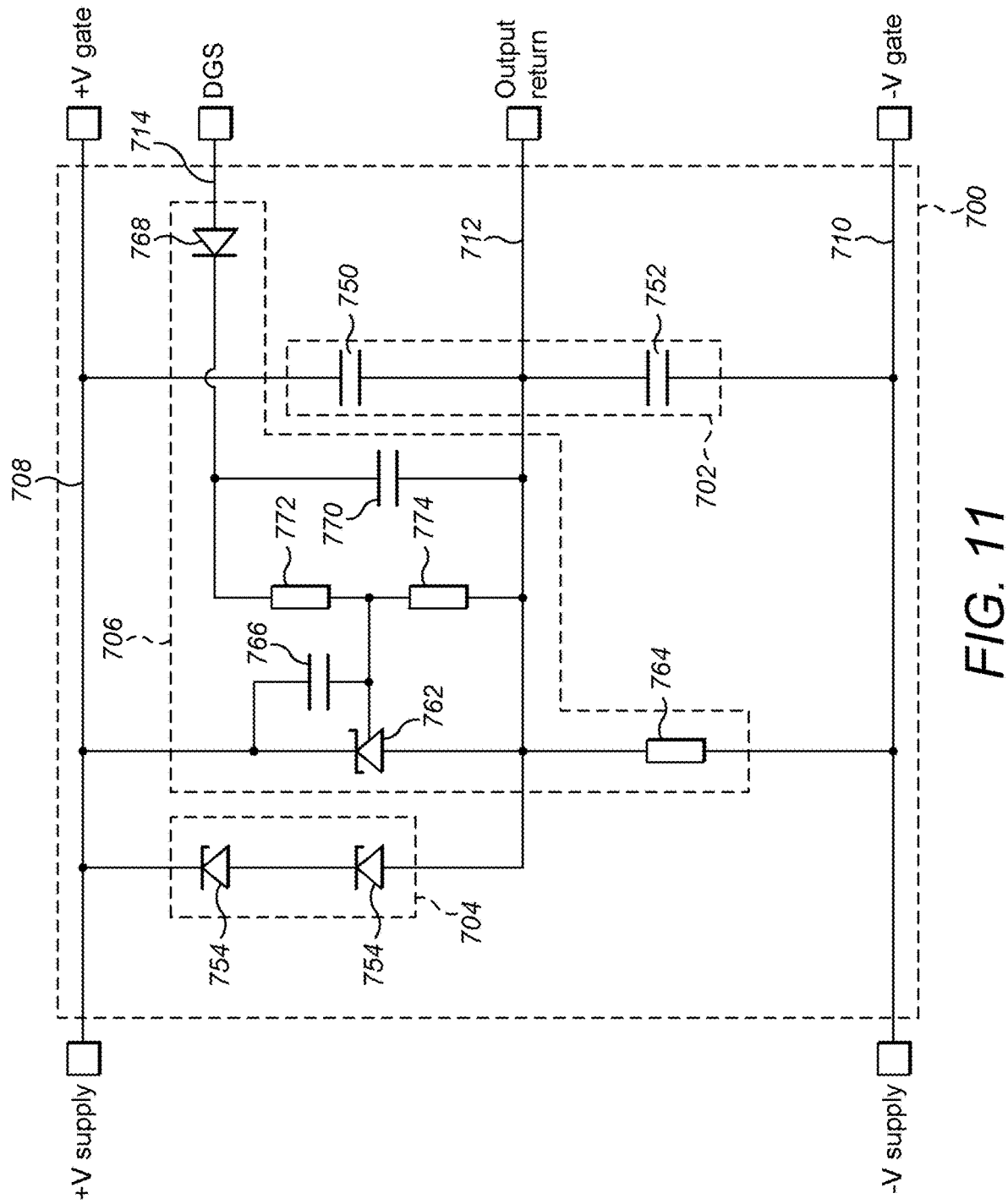
FIG. 11 shows a configuration of a power supply output device of the fourth preferred embodiment of the present invention.

A power supply output device of the fourth preferred embodiment is shown in FIG. 11. The power output supply of the fourth preferred embodiment is a specific example of a power output supply such as in the third preferred embodiment. The power supply output device 700 of FIG. 11 includes a voltage divider 702, a voltage clamp 704 and an adjusting circuit 706, connected as in the third preferred embodiment. In the fourth preferred embodiment the voltage clamp 704 is connected to the adjusting circuit 706 via the output return line 712 only, and not via an additional connection as in the first and second preferred embodiments.

The voltage divider 702 and the adjusting circuit 706 are the same as the corresponding components of the second preferred embodiment. The voltage divider 702 includes a first capacitor 750 and a second capacitor 752. The adjusting circuit 706 includes a reference diode 762, a first resistor 764, a third capacitor 766, a peak detector 768, a fourth capacitor 770, a second resistor 772, and a third resistor 774. Similar alternatives described in the second preferred embodiment are also possible in the fourth preferred embodiment.

The voltage clamp 704 of the fourth preferred embodiment includes one or more Zener diodes 754 connected in series and in the same direction, between the upper supply rail 708 and the output return line 712. In an alternative preferred embodiment, the one or more Zener diodes 754 could be replaced with one or more reference diodes.

The power supply output device 700 of FIG. 11 can be used as the output circuitry 304 in a system configured as in FIG. 5, in the same way as the power supply device 500 of the second preferred embodiment.

At switch on, the voltage supplied by the DC-DC converter 302 appears across the voltage divider, +V supply with respect to −V supply in FIG. 11. The voltage divider 702 then divides the voltage between the first capacitor 750 and the second capacitor 752. The first capacitor 750 and second capacitor 752 have equal capacitance so that the voltage is initially split equally between them. For example, if a 9−V supply is used, the voltage drop across each of the capacitors would be 4.5 V.

Because the second capacitor 752 and the second resistor 764 are connected in parallel, the second capacitor 752 starts to discharge through the second resistor 764, and therefore, the voltage across the first capacitor 750 starts to increase. The reference diode 762 does not allow any current to flow through the reference diode 762 when there is no signal input into the DGS line 714. When the voltage across the first capacitor 750 reaches the total Zener breakdown voltage one or more Zener diodes 754, the one or more Zener diodes 754 start to conduct. In the fourth preferred embodiment, this total Zener breakdown voltage is chosen to be above the peak positive voltage required for the power switch 308, for example +6.6 V if the required voltage is +6 V. At the point where the one or more Zener diodes 754 conduct, the positive and negative gate voltages reach a balance where, in this case, the voltage +V gate is +6.6 V with respect to the output return line 712, and the voltage −V gate is −2.4 V with respect to the output return line 712.

Next, a signal V gate produced by the gate driver circuit 306 is input to the DGS line 714 via the DGS line 312. The pulse waveform of the signal V gate is input into the peak detector 768. As an example, the peak detector 768 in the fourth preferred embodiment is a diode which peak rectifies the signal V gate. This charges the fourth capacitor 770 to the peak positive voltage of the signal V gate minus the voltage drop over the peak detector 768. For example, in this case the peak positive voltage of the signal V gate is +6.6 V minus the losses in the gate driver circuit, and the voltage drop over the diode of the peak detector 768 is 0.6 V; therefore, the fourth capacitor charges to +6 V minus the losses in the gate driver circuit 306. The voltage across the fourth capacitor 770 is sensed by the adjustable reference diode 762 through the potential divider of the second and third resistors 772, 774. The resistances of the second and third resistors 772, 774 are selected so that when the voltage across the second and third resistors 772, 774 is above the required positive peak voltage of the signal V gate minus the voltage drop over the peak detector 768, the reference diode 762 shunts current. This causes the first capacitor 750 to discharge through the reference diode 762. In this case, the voltage drop over the diode is 0.6 V, so the reference diode 762 will shunt current from the first capacitor 750 when the voltage across the second and third resistors 772, 774 is above +6 V −0.6 V=5.4 V.

The decreasing voltage across the first capacitor 750 causes the voltage +V gate to decrease, and therefore causes the peak positive voltage of the signal V gate to decrease, and thus the voltage across the second and third resistors 772, 774 to decrease. The one or more Zener diodes 754 of the voltage clamp 704 are now below their breakdown voltage, so current no longer flows through the voltage clamp 704. When the voltage across the second and third resistors 772, 774 reaches the required positive peak voltage of the signal V gate minus the voltage drop over the peak detector 768, the reference diode 762 clamps the voltage across the first capacitor 750. At this point, the circuit is balanced with the voltage across the first capacitor 750 held at the required positive peak voltage of the signal V gate plus the voltage to compensate for the losses in the gate driver circuit 306.

For example, a +6−V voltage is required as the peak positive voltage of the gate driver circuit 305 output, but in fact +6.2 V is received via the DGS line 714 at the gate of the power switch 308 from the initial +6.6 V of the voltage +V gate. Therefore, when the signal V gate is input into the DGS line 714, the fourth capacitor charges to +6.2 V−0.6 V=5.6 V, and the voltage across the second and third resistors 772, 774 is above +5.4 V. The reference diode 762 therefore shunts current until the voltage across the first capacitor 750 reaches +6.6 V−0.2 V=6.4 V. Now, the reference diode 762 regulates the positive voltage +V gate such that the peak positive voltage of the signal V gate is always +6 V, by sensing the gate of the power switch 308 directly. These voltage values are exemplary only and are not limiting. Various alternatives are possible.

The third capacitor 766 provides negative feedback, to prevent any input noise at the reference terminal of the reference diode 762 from causing rapid fluctuations in the output at the cathode of the reference diode 762.

Figure 12A:
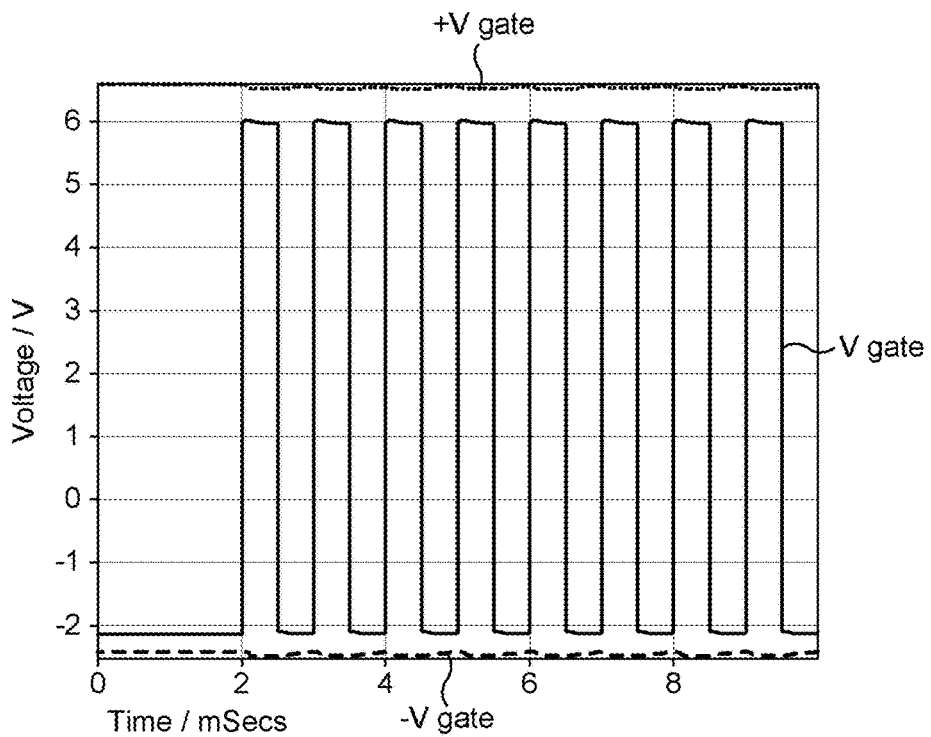
FIG. 12A is a graph showing advantages of the fourth preferred embodiment of the present invention.
Figure 12B:
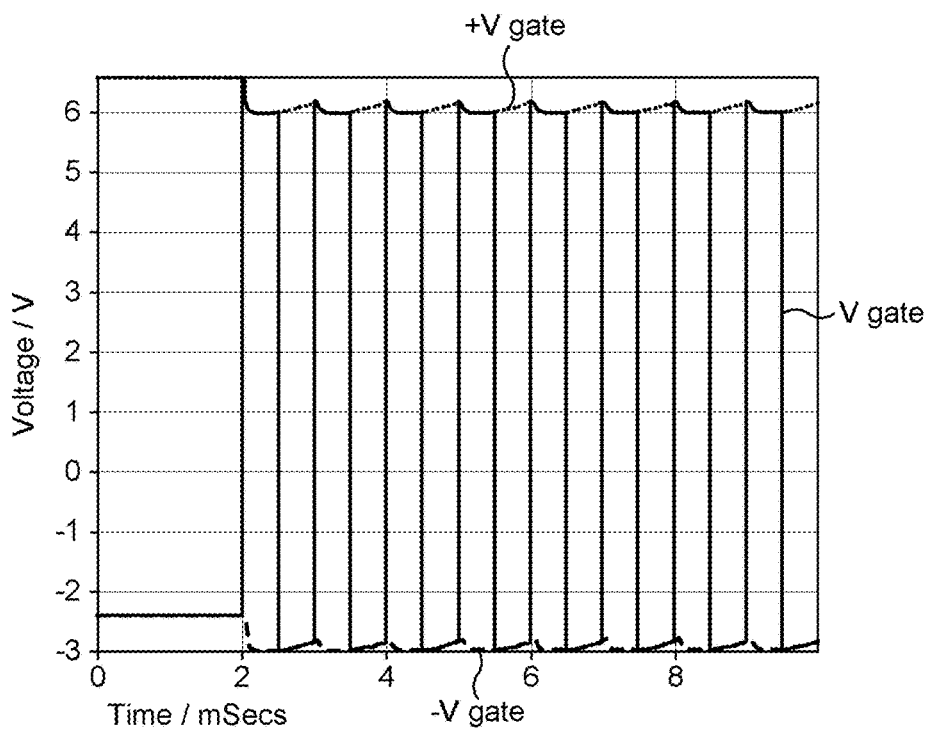
FIG. 12B is a graph showing advantages of the fourth preferred embodiment of the present invention.

The advantages of the fourth preferred embodiment are similar to those of the first and second preferred embodiments. The resulting gate voltage waveform of the signal V gate from the gate driving circuit 306 using the power supply output device 700 of the fourth preferred embodiment is shown in FIGS. 12A and 12B. To produce these graphs a 9-V supply from the DC-DC converter was used, and the components used were first and second capacitors 750, 752 with a 4.7-µF capacitance, two BZX84-3V3 Zener diodes as the one or more Zener diodes 754, a TL431 reference diode 762, a 1-kΩ first resistor 764, a 1-nF third capacitor 766, a 31-kΩ second resistor 772, a 25-kΩ third resistor 774, a 10-nF fourth capacitor 770, and a BAS70-06 diode as the peak detector 768. Specific components and given values are exemplary only. Various alternatives could be used, as would be understood by those skilled in the art.

FIG. 12A shows the operation of the system when there is a voltage drop of 1 V in the gate driver circuit 306. The voltage clamp 704 holds the voltage +V gate at +6.6 V initially. At 2 ms, the DGS line 714 is connected to gate of the power switch 308. The peak positive voltage at the gate of the power switch 308 is +6 V and is therefore already at the desired voltage. The peak positive voltage of the signal V gate is then kept at +6 V by the circuit, even if there are fluctuations in the power supply or gate driver circuit 306 output.

Accurate control of the peak positive voltage of the signal V gate results in the peak negative voltage of the signal V gate being about -2 V in the example in FIG. 12A. However, the peak negative voltage does not have to be as accurate as the peak positive voltage in power switch applications.

FIG. 12B is a similar graph to FIG. 12A except that FIG. 12B is the case where there is no voltage loss in the gate driver circuit 306. The voltage clamp 704 holds the voltage +V gate at +6.6 V initially. When the DGS line 714 is connected to the gate of the power switch 308, a peak positive voltage of the signal V gate equal to +6.6 V is detected by the reference diode 762. The power output supply device 700 then rapidly decreases the voltage +V gate until the peak positive voltage of the signal V gate reaches +6 V as desired in this example. The peak positive voltage of the signal V gate is then kept at +6 V by the circuit, even if there are fluctuations in the power supply or gate driver circuit 306 output. Both of FIGS. 12A and 12B demonstrate advantages over the output of the prior art systems of FIGS. 2A to 3.

A similar effect as described in the second preferred embodiment causes the slight deviations of the peak positive voltage of the signal V gate in FIGS. 12A and 12B.

This preferred embodiment of the present invention could be applied to any power switch gate drive application, including but not limited to those in motor drives, inverters, uninterruptible power sources (UPS), solar power, electric vehicles, and so on.

Although in this preferred embodiment the positive gate voltage +V gate is regulated, to hold the peak positive voltage of the signal V gate at the required value, the power rails could be reversed so that accurate control of the peak negative voltage of the signal V gate was performed, if accurate control of the peak negative voltage of the signal V gate was desired.

Fifth Preferred Embodiment of the Present Invention

Figure 13:
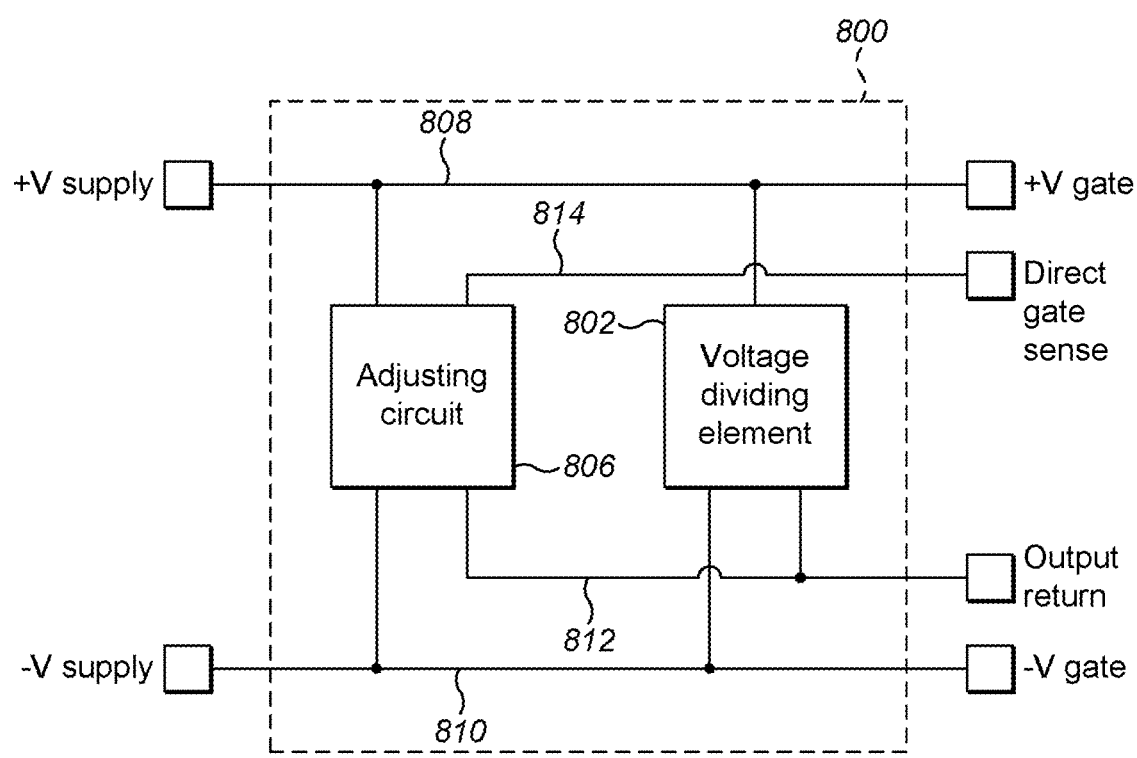
FIG. 13 shows a configuration of a power supply output device of the fifth preferred embodiment of the present invention.

FIG. 13 shows an example of a configuration of a gate drive system 800 of the fifth preferred embodiment. The fifth preferred embodiment is the same as the third preferred embodiment except that there is not a separate voltage clamp such as the voltage clamp 604 of the third preferred embodiment, but instead the voltage clamp is incorporated into the adjusting circuit 806.

As with the third preferred embodiment, the power supply output device 800 starts, before the signal V gate is input into the DGS line 312, with the positive gate voltage +V gate above the specifications for the power switch 308. When the gate signal V gate produced by the gate driver 306 is input to the DGS line 814, the adjusting circuit 806 transitions from clamping the voltage +V gate at the initial predetermined value, to adjusting and re-clamping the divided voltage such that an accurate positive peak voltage is at the power switch 308.

The voltage divider 802 is connected between the upper supply rail 808 and a lower supply rail 810. The voltage divider 802 is also connected to an output return line 812.

Sixth Preferred Embodiment of the Present Invention

Figure 14:
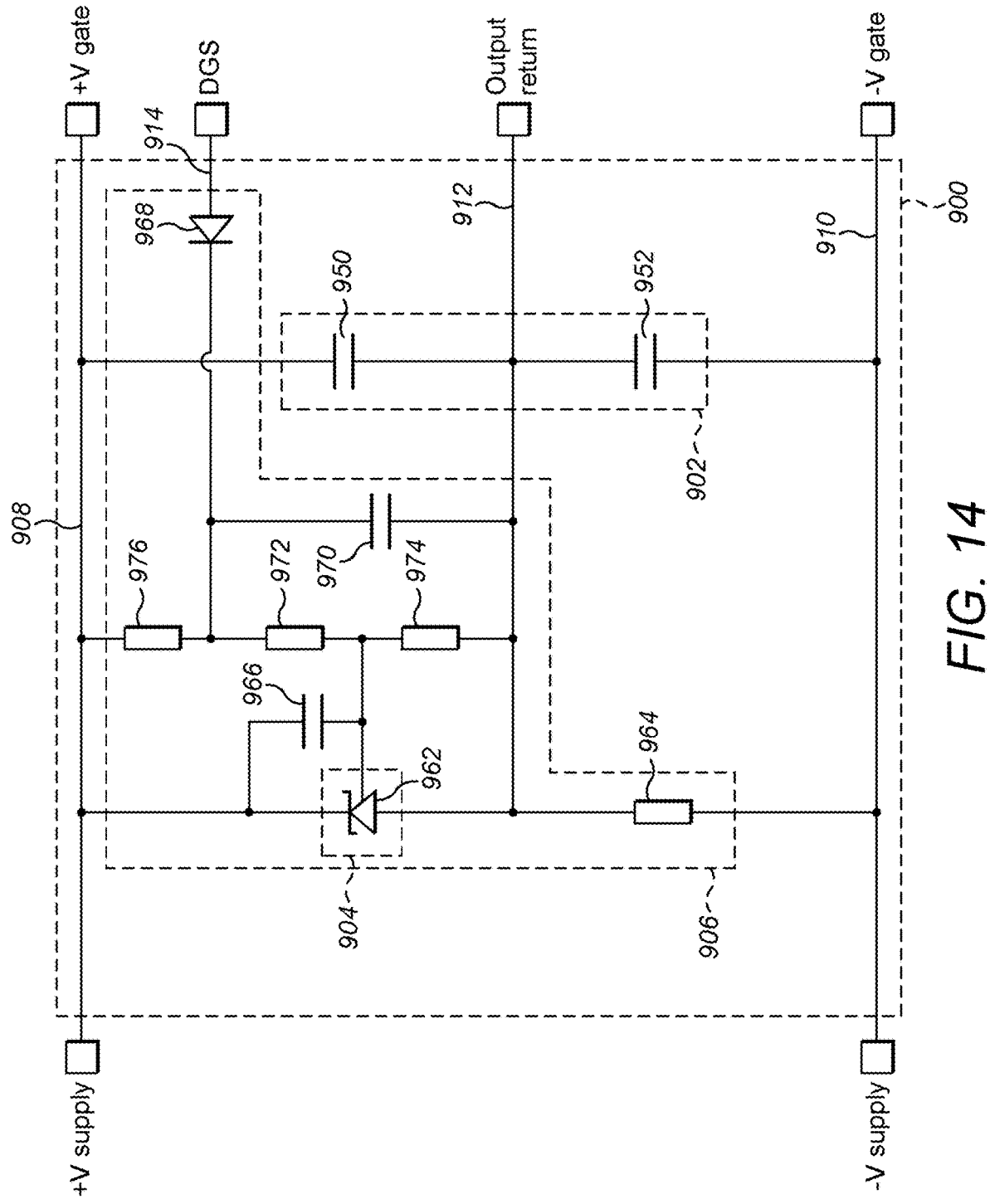
FIG. 14 shows a configuration of a power supply output device of the sixth preferred embodiment of the present invention.

A power supply output device of the sixth preferred embodiment is shown in FIG. 14. The power output supply of the sixth preferred embodiment is a specific example of a power output supply such as in the fifth preferred embodiment. The power supply output device 900 of FIG. 14 includes a voltage divider 902 and an adjusting circuit 906, connected as in the fifth preferred embodiment. In the sixth preferred embodiment the voltage clamp 904 is incorporated into the adjusting circuit 906.

The voltage divider 902 includes a first capacitor 950 and a second capacitor 952 connected in series between the upper supply rail 908 and the lower supply rail 910. The output return line 912 is connected to the voltage divider 902 between the first capacitor 950 and the second capacitors 952.

The adjusting circuit 906 includes the voltage clamp 904 in the sixth preferred embodiment. The voltage clamp 904 includes a reference diode 962 with the cathode connected to the upper supply rail 908 and the anode connected to the output return line 912. A first resistor 964 is connected between the output return line 912 and the lower supply rail 910. A third capacitor 966 is connected between the cathode terminal and the reference terminal of the reference diode 962. The adjusting circuit 906 includes a peak detector 968 which is connected to the DGS line 914. The peak detector 968 may be a peak rectifier, for example a diode, a P channel MOSFET, a Schottky diode, or the like. A second resistor 976 is connected between the output of the peak detector 968 and the upper supply rail 908. A fourth capacitor 970 is connected between the output of the peak detector 968 and the output return line 912. A third resistor 972 and a fourth resistor 974 in series are also connected between the output of the peak detector 968 and the output return line 912, in parallel with the fourth capacitor 970. The reference terminal of the reference diode 962 is connected to a point in-between the third resistor 972 and the fourth resistor 974.

Similar alternatives described in the second preferred embodiment are also possible in the sixth preferred embodiment.

The power supply output device 900 of FIG. 14 can be used as the output circuitry 304 in a system configured as in FIG. 5, in the same way as the power supply devices of the previous preferred embodiments.

At switch on, the voltage supplied by the DC-DC converter 302 appears across the voltage divider, +V supply with respect to −V supply in FIG. 14. The voltage divider 902 then divides the voltage between the first capacitor 950 and the second capacitor 952. The first capacitor 950 and second capacitor 952 have equal capacitance so that the voltage is initially split equally between them. For example, if a 9-V supply is used, the voltage drop across each of the capacitors would be 4.5 V.

Because the second capacitor 952 and the first resistor 964 are connected in parallel, the second capacitor 952 starts to discharge through the first resistor 964, and therefore, the voltage across the first capacitor 950 starts to increase. The first capacitor 950 could also discharge through the second, third, and fourth resistors 976, 972, 974. However, the resistance of the first resistor 964 is chosen to be much lower than the total resistance of the second, third, and fourth resistors 976, 972, 974, so that the second capacitor 952 discharges more rapidly than the first capacitor 950, causing the first capacitor 950 to charge up.

With no signal input into the DGS line 914, the reference diode 962 is controlled by the potential divider of the second, third, and fourth resistors 976, 972, 974. In the sixth preferred embodiment, the resistances of the second, third, and fourth resistors 976, 972, 974 are chosen so that the potential divider sets the reference diode 962 to start to regulate the voltage +V gate at a voltage above the peak positive voltage required of the power switch 308, for example, +6.6 V if the required voltage is +6 V. When the voltage across the first capacitor 950 reaches +6.6 V, the reference diode 962 starts to conduct. At this point the positive and negative gate voltages reach a balance where, in this case, the voltage +V gate is +6.6 V with respect to the output return line 912, and the voltage −V gate is −2.4 V with respect to the output return line 912. The reference diode 962 is therefore initially acting as the voltage clamp 904 before any pulses appear at the DGS input. The reference diode 962 clamps the positive gate voltage +V gate in a similar fashion to the voltage clamps of the first, second, third, and fourth preferred embodiments.

Next, a signal V gate produced by the gate driver circuit 306 is input to the DGS line 914 via the DGS line 312. The pulse waveform of the signal V gate is input into the peak detector 968. As an example, the peak detector 968 in the sixth preferred embodiment is a diode which peak rectifies the signal V gate. This charges the fourth capacitor 970 to the peak positive voltage of the signal V gate minus the voltage drop over the diode. For example, in this case, the peak positive voltage of the signal V gate is +6.6 V minus the losses in the gate driver circuit, and the voltage drop over the diode of the peak detector 968 is 0.6 V; therefore, the fourth capacitor charges to +6 V minus the losses in the gate driver circuit 306. The voltage across the fourth capacitor 970 is sensed by the adjustable reference diode 962 through the two lower potential divider resistors, the third and fourth resistors 972, 974. The resistances of the third and fourth resistors 972, 974 are chosen so that when the voltage across the third and fourth resistors 972, 974 is above the required positive peak voltage of the signal V gate, minus the voltage drop over the peak detector 968, the reference diode 962 shunts current. This causes the first capacitor 950 to discharge through the reference diode 962. The reference diode 962 therefore has a dual purpose, initially acting as the voltage clamp 904, and then adjusting and re-clamping the voltage +V gate once a DGS line signal is input.

The decreasing voltage across the first capacitor 950 causes the voltage +V gate to decrease, and therefore causes the peak positive voltage of the signal V gate to decrease, and thus the voltage across the third and fourth resistors 972, 974 to decrease. When the voltage across the third and fourth resistors 972, 974 reaches the required positive peak voltage of the signal V gate minus the voltage drop over the peak detector 968, the reference diode 962 clamps the voltage across the first capacitor 950. At this point the circuit is balanced with the voltage across the first capacitor 950 held at the required positive peak voltage of the signal V gate plus the voltage to compensate for the losses in the gate driver circuit 306.

The third and fourth resistors 972, 974 are selected to allow the reference diode 962 to shunt current when the voltage input into the DGS line 914 is above the required voltage for the power switch 308, for example, +6 V. In this example, a +6-V voltage is required as the peak positive voltage of the gate driver circuit 305 output, but in fact +6.2 V is received via the DGS line 914 at the gate of the power switch 308 from the initial +6.6 V of the voltage +V gate. Therefore, when the signal V gate is input into the DGS line 914, the fourth capacitor charges to +6.2 V−0.6 V=5.6 V and the voltage across the third and fourth resistors 972, 974 is above +5.4 V. The reference diode 962 therefore shunts current until voltage across the third and fourth resistors 972, 974 reaches +5.4 V. Now, the reference diode 962 regulates the positive voltage +V gate such that the peak positive voltage of the signal V gate is always +6 V, by sensing the gate of the power switch 308 directly. These voltage values are exemplary only and are not limiting. Various alternatives are possible.

The third capacitor 966 provides negative feedback, to prevent any input noise at the reference terminal of the reference diode 962 from causing rapid fluctuations in the output at the cathode of the reference diode 962.

Figure 15A:
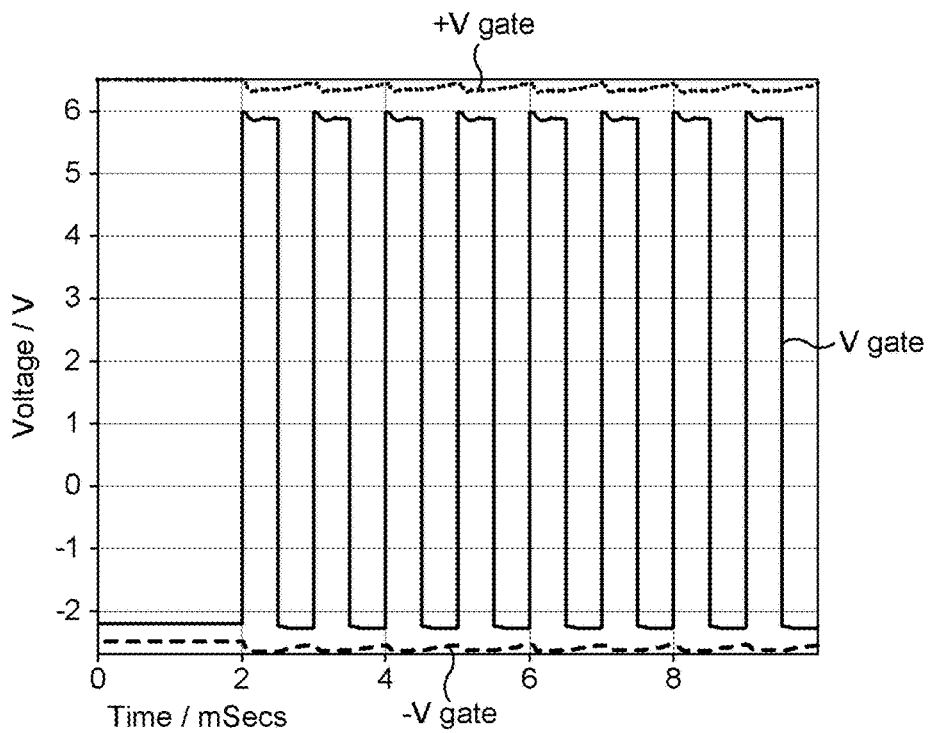
FIG. 15A is a graph showing the advantages of the sixth preferred embodiment of the present invention.
Figure 15B:
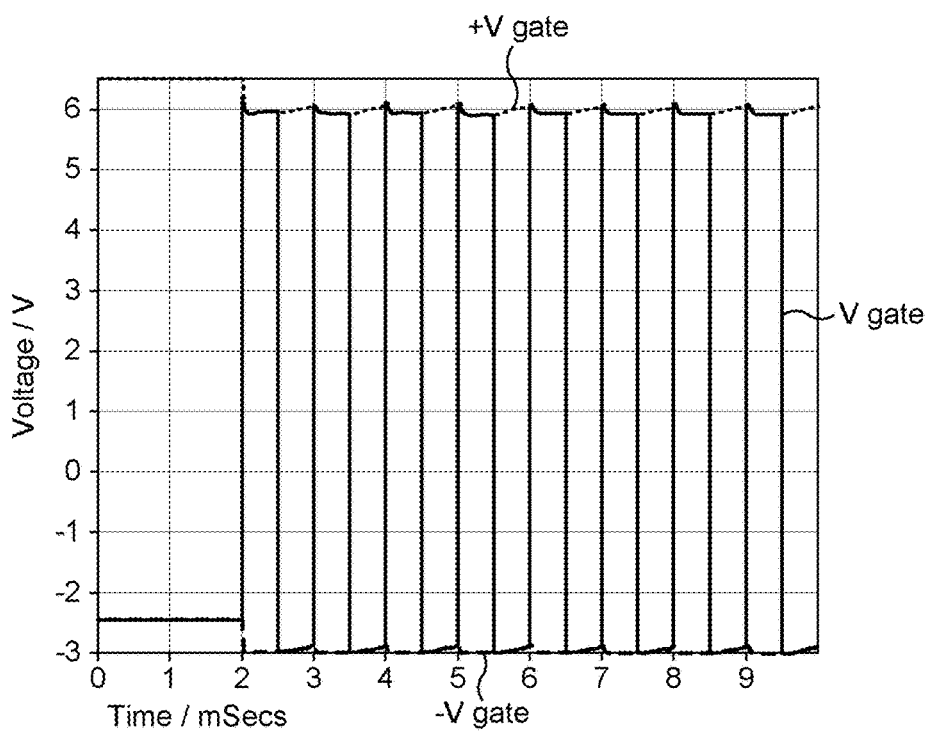
FIG. 15B is a graph showing the advantages of the sixth preferred embodiment of the present invention.

The advantages of the sixth preferred embodiment are similar to those of the previous preferred embodiments. The resulting gate voltage waveform of the signal V gate from the gate driving circuit 306 using the power supply output device 900 of the sixth preferred embodiment is shown in FIGS. 15A and 15B. To produce these outputs a 9-V supply from the DC-DC converter was used, and the components used were first and second capacitors 950, 952 with a 4.7-μF capacitance for each capacitor, a TL431 reference diode 962, a 1-kΩ first resistor 964, a 1-nF third capacitor 966, a 12-kΩ second resistor 976, 29-kΩ third resistor 972, a 25-kΩ fourth resistor 974, a 10-nF fourth capacitor 970, and a BAS70-06 diode as the peak detector 968. Specific components and given values are exemplary only. Various alternatives could be used, as would be understood by those skilled in the art.

FIG. 15A shows the operation of the system when there is a voltage drop of 1 V in the gate driver circuit 306. The voltage clamp 904 holds the voltage +V gate at +6.6 V initially. At 2 ms, the DGS line 914 is connected to gate of the power switch 308. The peak positive voltage at the gate of the power switch 308 is +6 V and is therefore already at the desired voltage to drive the power switch 308. The peak positive voltage of the signal V gate is then kept at +6 V by the circuit, even if there are fluctuations in the power supply or gate driver circuit 306 output.

Accurate control of the peak positive voltage of the signal V gate results in the peak negative voltage of the signal V gate being about −2.4 V in the example in FIG. 15A. However, the peak negative voltage does not have to be as accurate as the peak positive voltage in power switch applications.

FIG. 15B is a similar graph to FIG. 15A except that FIG. 15B is the case where there is no voltage loss in the gate driver circuit 306. The voltage clamp 904 holds the voltage +V gate at +6.6 V initially. When the DGS line 914 is connected to the gate of the power switch 308, a peak positive voltage of the signal V gate equal to +6.6 V is detected by the reference diode 762. The power output supply device 700 then rapidly decreases the voltage +V gate until the peak positive voltage of the signal V gate reaches +6 V as desired in this example. The peak positive voltage of the signal V gate is then kept at +6 V by the circuit, even if there are fluctuations in the power supply or gate driver circuit 306 output. Both of FIGS. 15A and 15B demonstrate advantages over the output of the prior art systems of FIGS. 2A to 3.

A similar effect as described in the second preferred embodiment causes the slight deviations of the peak positive voltage of the signal V gate in FIGS. 15A and 15B.

This preferred embodiment of the present invention could be applied to any power switch gate drive application, including but not limited to those in motor drives, inverters, uninterruptible power sources (UPS), solar power, electric vehicles, and so on.

Although in this preferred embodiment the positive gate voltage +V gate is regulated, to hold the peak positive voltage of the signal V gate at the required value, the power rails could be reversed so that accurate control of the peak negative voltage of the signal V gate was performed, if accurate control of the peak negative voltage of the signal V gate was desired.

Seventh Preferred Embodiment of the Present Invention

Figure 16:
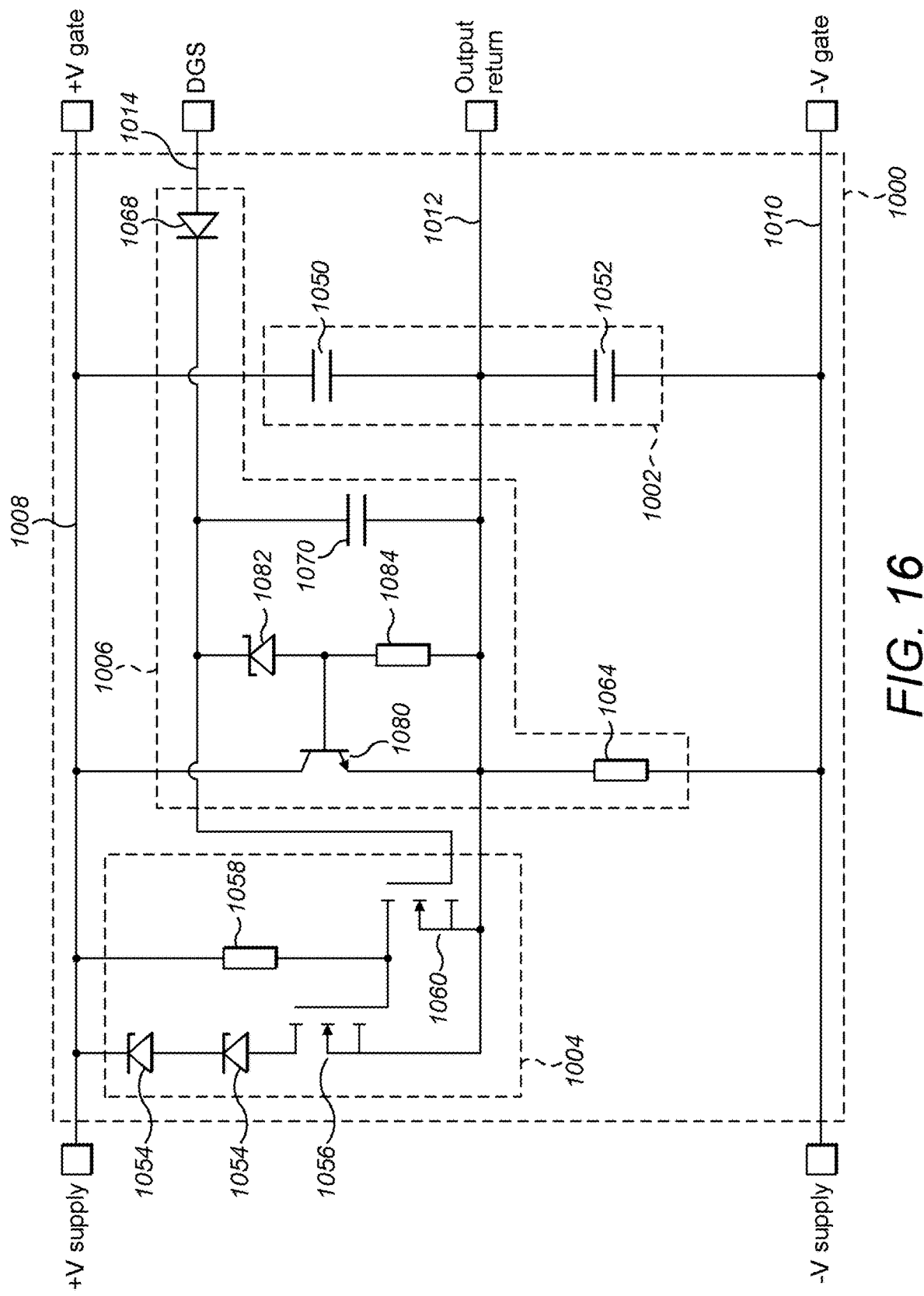
FIG. 16 shows a configuration of a power supply output device of the seventh preferred embodiment of the present invention.

FIG. 16 shows a seventh preferred embodiment of the power supply output device. The power supply output device 1000 of the seventh preferred embodiment differs from the power supply output device 500 of the second preferred embodiment through the removal of the reference diode 562, third capacitor 566, third resistor 572, and a fourth resistor 574 of the second preferred embodiment. These components have been replaced in the seventh preferred embodiment with a third switch 1080, a Zener diode 1082, and a third resistor 1084. The power supply output device 1000 of FIG. 16 includes an upper supply rail 1008, a lower supply rail 1010, a voltage divider 1002, a voltage clamp 1004, and an adjusting circuit 1206.

The seventh preferred embodiment includes a first capacitor 1050, a second capacitor 1052, one or more Zener diodes 1054, a first switch 1056, a second switch 1060, a first resistor 1058, a third switch 1080, a second resistor 1064, a third capacitor 1070, a third resistor 1084, a Zener diode 1082, and a peak detector 1068.

The third switch 1080 can be a transistor, for example, a bipolar transistor or a field effect transistor such as a MOSFET. In the seventh preferred embodiment an N-type bipolar transistor has been used as an example.

The voltage clamp 1004 and the voltage divider 1002 in the seventh preferred embodiment are the same as in the second preferred embodiment.

In the adjusting circuit 1006 the collector of the N-type transistor is connected to the upper supply rail 1008 and the emitter of the transistor is connected to the output return line 1012. The cathode of the Zener diode 1082 is connected to the output of the peak detector 1068, and the anode of the Zener diode 1082 is connected to the output return line 1012 via the third resistor 1084. The base of the third switch 1080 is connected to a point between the Zener diode 1082 and the third resistor 1084.

The power supply output device 1000 of the seventh preferred embodiment operates in the same way as the power supply output device 500 of the second preferred embodiment up until the point when the voltage clamp 1004 is switched off. At this point, when a signal is input into the DGS line 1014, the third capacitor 1070 is charged to the peak positive voltage of the signal V gate minus the voltage drop over the peak detector 1068. Initially, the Zener diode 1082 remains below the breakdown voltage For the Zener diode 1082. Therefore, no current flows through the Zener diode 1082 initially so that the third switch 1080 remains turned off, as no current flows into the base terminal of the third switch 1080.

The voltage across the first capacitor 1050, and therefore the positive gate voltage +V gate, is no longer clamped to the Zener breakdown voltage of the one or more Zener diodes 1054, as the input into the DGS line 1014 switches the voltage clamp 1004 off. The second capacitor 1052 will then shunt current through the second resistor 1064, causing the voltage across the first capacitor 1050 to increase. The increasing voltage across the first capacitor 1050 causes the voltage +V gate to increase, and therefore causes the peak positive voltage of the signal V gate to increase, and thus the voltage across Zener diode 1082 and the third resistor 1084 to increase. When the voltage across Zener diode 1082 is at its Zener breakdown voltage, the Zener diode 1082 starts to allow current to flow. This switches on the third switch 1080, through which the first capacitor 1050 can discharge. At this point the circuit is balanced with the voltage across the first capacitor 1050 held at the required positive peak voltage of the signal V gate plus the voltage to compensate for the losses in the gate driver circuit 306.

In the seventh preferred embodiment, the third switch 1080 shunts current from the first capacitor 1050 and the Zener diode 1082 acts as a voltage detection device, measuring the voltage input into the DGS line 1014 with respect to the output return line 1012. In this preferred embodiment, the Zener diode 1082 passes as little current as possible.

An example of the components used for the seventh preferred embodiment to maintain a positive gate voltage +V gate of +6 V from a 9–V supply from a DC-DC converter are first and second capacitors 1050, 1052 with a 4.7-µF capacitance, two BZX84-3V0 Zener diodes as the one or more Zener diodes 1054, two 2N7000 N channel MOSFETs as the first and second switches 1056, 1060, a 10-kΩ first resistor 1058, a Q2N2222 N-type bipolar transistor as the third switch 1080, a 1-kΩ second resistor 1064, a 10-nF third capacitor 1070, a 1-kΩ third resistor 1084, a BZX84C5V1 Zener diode 1082, and a BAS70-06 diode as the peak detector 1068. Specific components and given values are exemplary only. Various alternatives could be used, as would be understood by those skilled in the art.

The Zener diode used in this example has a Zener breakdown voltage of 5.1 V. When the Zener diode reaches this voltage, the Zener diode allows a small amount of current to flow, typically 1 mA to 5 mA. In this example, the third resistor 1084 is chosen to have a voltage drop of about 0.6 V at this current, and therefore the base emitter voltage of the third switch 1080 is 0.6 V, which is enough voltage to switch on the third switch 1080. The total voltage across Zener diode 1082 and third resistor 1084 at this point is 5.1 V+0.6 V=5.7 V. Therefore, it appears that before the 0.6 V drop over the peak detector 1068, the signal V gate must be +6.3 V when the third switch 1080 is switched on and the voltage is clamped. However, as discussed in the second preferred embodiment, the third capacitor 1070 is charged on average to slightly below the peak positive voltage of the signal V gate minus the voltage drop over the peak detector. Furthermore, the Zener diode 1082 may first start conducting at a lower current than 1 mA, meaning the voltage across the Zener diode 1082 at which the third switch 1080 is switched on will therefore be slightly lower than 5.1 V required of the Zener diode. The combination of these two effects results in the selected components clamping the peak positive voltage of the signal V gate not at +6.3 V, but at the +6 V as required. Similar allowances can be made when different components, other than the ones listed above, are used.

The advantages of the seventh preferred embodiment are the same as the second preferred embodiment.

Eighth Preferred Embodiment of the Present Invention

Figure 17:
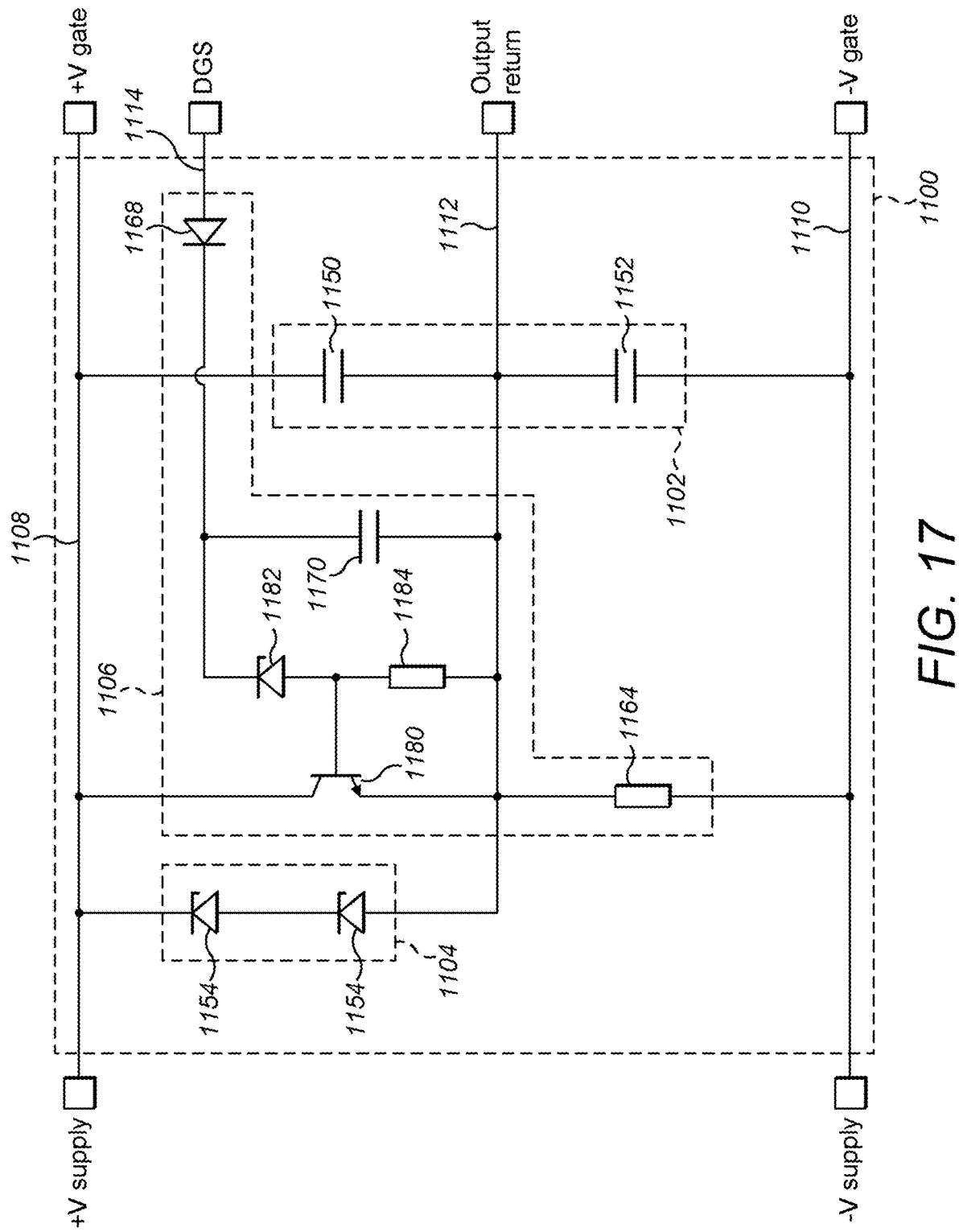
FIG. 17 shows a configuration of a power supply output device of the eighth preferred embodiment of the present invention.

FIG. 17 shows an eighth preferred embodiment of the power supply output device. The power supply output device 1100 of the eighth preferred embodiment differs from the fourth preferred embodiment by the same alterations as made in the seventh preferred embodiment. The power supply output device 1100 of FIG. 17 includes an upper supply rail 1108, a lower supply rail 1110, a voltage divider 1102, a voltage clamp 1104, and an adjusting circuit 1106.

The eighth preferred embodiment includes a first capacitor 1150, a second capacitor 1152, one or more Zener diodes 1154, a first switch 1180, a first resistor 1164, a third capacitor 1170, a second resistor 1184, a Zener diode 1182, and a peak detector 1168.

The power supply output device 1100 of the eighth preferred embodiment operates in the same way as the power supply output device 700 of the fourth preferred embodiment up until the point when the signal V gate produced by the gate driver circuit 306 is input to the DGS line 1114. At this point the third capacitor 1170 is charged to the peak positive voltage of the signal V gate minus the voltage drop over the peak detector 1168. The Zener diode 1182 is above the breakdown voltage of the Zener diode 1182 due to the initial voltage of the voltage +V gate being set by the voltage clamp 1154 above the required voltage, for example, +6.6 V, and therefore, the peak positive voltage of the signal V gate is above the required voltage. Current therefore flows through the Zener diode 1182, which turns on the first switch 1180.

The first switch 1180 therefore shunts current allowing the first capacitor 1150 to discharge. The decreasing voltage across the first capacitor 1150 causes the voltage +V gate to decrease, and therefore causes the peak positive voltage of the signal V gate to decrease. The Zener diodes 1154 of the voltage clamp 1104 are now below their breakdown voltage, so current no longer flows through the voltage clamp 1104. As the peak positive voltage of the signal V gate to decreases the voltage across the Zener diode 1182 drops below the breakdown voltage of the Zener diode 1182, and the Zener diode 1182 therefore stops allowing current to flow, which switches the first switch 1180 off. At this point the circuit is balanced with the voltage across the first capacitor 1150 held at the required positive peak voltage of the signal V gate plus the voltage to compensate for the losses in the gate driver circuit 1106.

In the eighth preferred embodiment, the first switch 1180 shunts current from the first capacitor 1150, and the Zener diode 1182 acts as a voltage detection device, measuring the voltage input into the DGS line 1114 with respect to the output return line 1112. In this preferred embodiment, the Zener diode 1182 passes as little current as possible.

An example of the components used for the eighth preferred embodiment to maintain a positive gate voltage +V gate of +6 V from a 9–V supply from a DC-DC converter are first and second capacitors 1150, 1152 with a 4.7-μF capacitance, two BZX84-3V3 Zener diodes as the one or more Zener diodes 1154, a Q2N2222 N-type bipolar transistor as the first switch 1180, a 1-kΩ first resistor 1164, a 10-nF third capacitor 1170, a 1-kΩ second resistor 1184, a BZX84C5V1 Zener diode 1182, and a BAS70-06 diode as the peak detector 1168. Specific components and given values are exemplary only. Various alternatives could be used, as would be understood by those skilled in the art.

Similar comments as discussed in the seventh preferred embodiment relating to the clamping the peak positive voltage of the signal V gate at +6 V not +6.3 V hold analogously for this example of the eighth preferred embodiment. Similar allowances can be made when different components, other than the ones listed above, are used.

The advantages of the eighth preferred embodiment are the same as the fourth preferred embodiment.

Ninth Preferred Embodiment of the Present Invention

Figure 18:
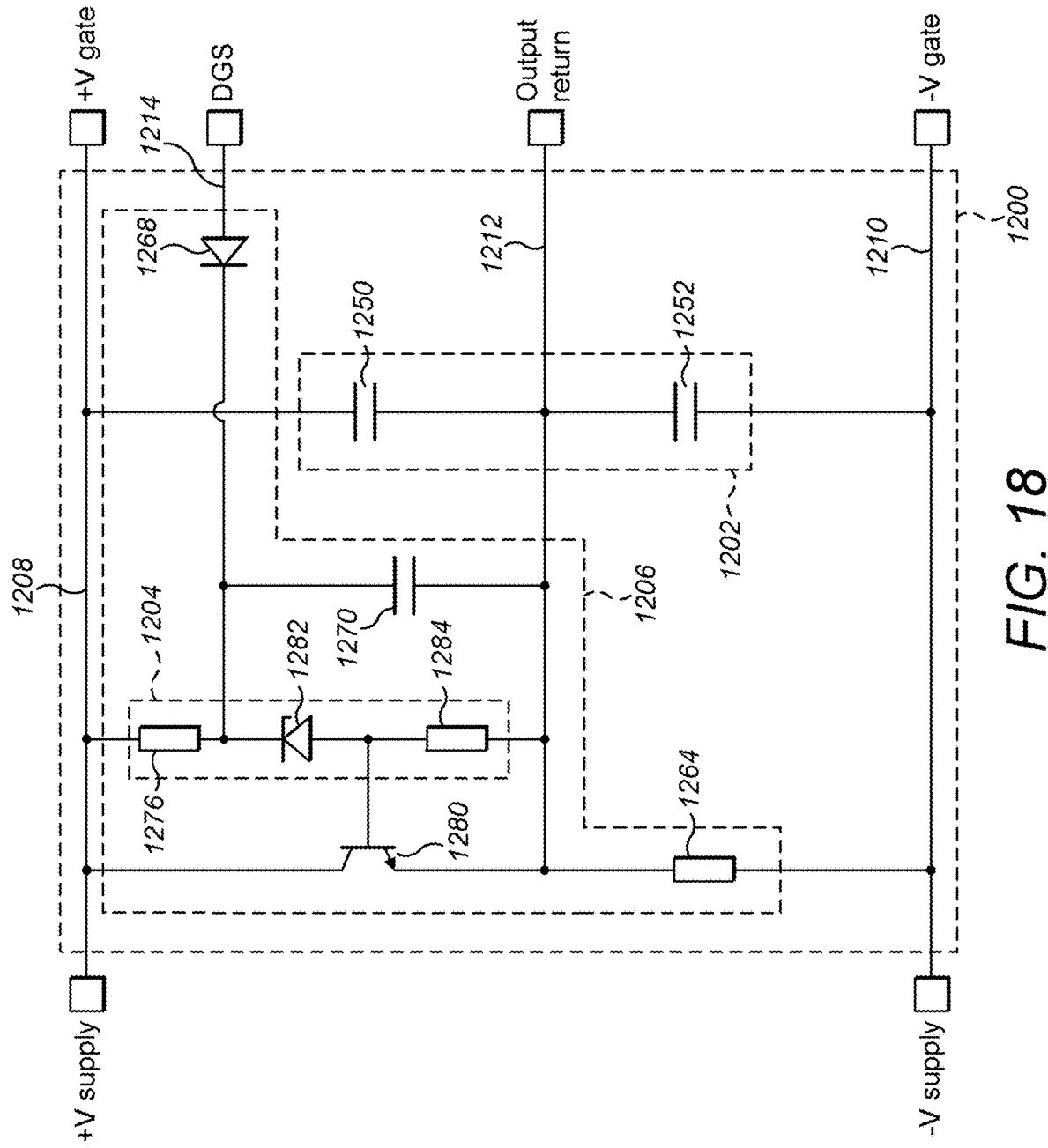
FIG. 18 shows a configuration of a power supply output device of the ninth preferred embodiment of the present invention.

FIG. 18 shows a ninth preferred embodiment of the power supply output device. The power supply output device 1200 of the ninth preferred embodiment differs from the sixth preferred embodiment by the same alterations as made in the seventh and eighth preferred embodiments. The power supply output device 1200 of FIG. 18 includes an upper supply rail 1208, a lower supply rail 1210, a voltage divider 1202, and an adjusting circuit 1206.

The ninth preferred embodiment includes a first capacitor 1250, a second capacitor 1252, a first switch 1280, a first resistor 1264, a third capacitor 1270, a second resistor 1284, a Zener diode 1282, a third resistor 1276, and a peak detector 1268.

In the power supply output device 1200 of the ninth preferred embodiment, the Zener diode 1282, in combination with the second resistor 1284 and the third resistor 1276, acts as the voltage clamp initially. The second capacitor 1252 discharges through the first resistor 1264, charging the first capacitor 1250 and increasing the voltage +V gate until the voltage clamp 1204 allows current to flow. Current flowing through the Zener diode 1282 switches on the first switch 1280, which prevents the first capacitor from charging further. The voltage across the first capacitor 1250, the voltage +V gate, is therefore clamped at the voltage at which the voltage clamp 1204 allows current to flow. In the ninth preferred embodiment, the voltage +V gate is clamped above the specification for the power switch 308 initially, for example, at +6.4 V.

When the signal V gate produced by the gate driver circuit 306 is input to the DGS line 1214, the third capacitor 1270 is charged to the peak positive voltage of the signal V gate minus the voltage drop over the peak detector 1268. The Zener diode 1282 is above breakdown voltage of the Zener diode 1282 due to the initial voltage of the voltage +V gate being set above the required voltage, for example, +6.4 V, and therefore the peak positive voltage of the signal V gate is above the required voltage. Current therefore flows through the Zener diode 1282, which turns on the first switch 1280.

The first switch 1280 therefore shunts current allowing the first capacitor 1250 to discharge. The decreasing voltage across the first capacitor 1250 causes the voltage +V gate to decrease, and therefore causes the peak positive voltage of the signal V gate to decrease. This causes the voltage across the Zener diode 1282 to drop below the breakdown voltage of the Zener diode 1282, and therefore the Zener diode 1282 stops allowing current to flow, which switches the first switch 1280 off. At this point, the circuit is balanced with the voltage across the first capacitor 1250 held at the required positive peak voltage of the signal V gate plus the voltage to compensate for the losses in the gate driver circuit 306.

In the ninth preferred embodiment, the first switch 1280 shunts current from the first capacitor 1250. The Zener diode 1282 acts as a voltage detection device, measuring the voltage +V gate through the third resistor 1276 initially, and then measuring the voltage input into the DGS line 1214 with respect to the output return line 1212. In this preferred embodiment, the Zener diode 1282 passes as little current as possible.

An example of the components used for the ninth preferred embodiment to maintain a positive gate voltage +V gate of +6 V from a 9-V supply from a DC-DC converter are first and second capacitors 1250, 1252 with a 4.7-µF capacitance, a Q2N2222 N-type bipolar transistor as the first switch 1280, a 1-kΩ first resistor 1264, a 10-nF third capacitor 1270, a 1-kΩ second resistor 1284, a BZX84C5V1 Zener diode 1282, a 1.5-kΩ third resistor 1276, and a BAS70-06 diode as the peak detector 1268. Specific components and given values are exemplary only. Various alternatives could be used, as would be understood by those skilled in the art.

Similar comments as discussed in the seventh preferred embodiment relating to the clamping the peak positive voltage of the signal V gate at +6 V not +6.3 V hold analogously for this example of the ninth preferred embodiment. Similar allowances can be made when different components, other than the ones listed above, are used.

The advantages of the ninth preferred embodiment are the same as the sixth preferred embodiment.

Tenth Preferred Embodiment

Figure 19:
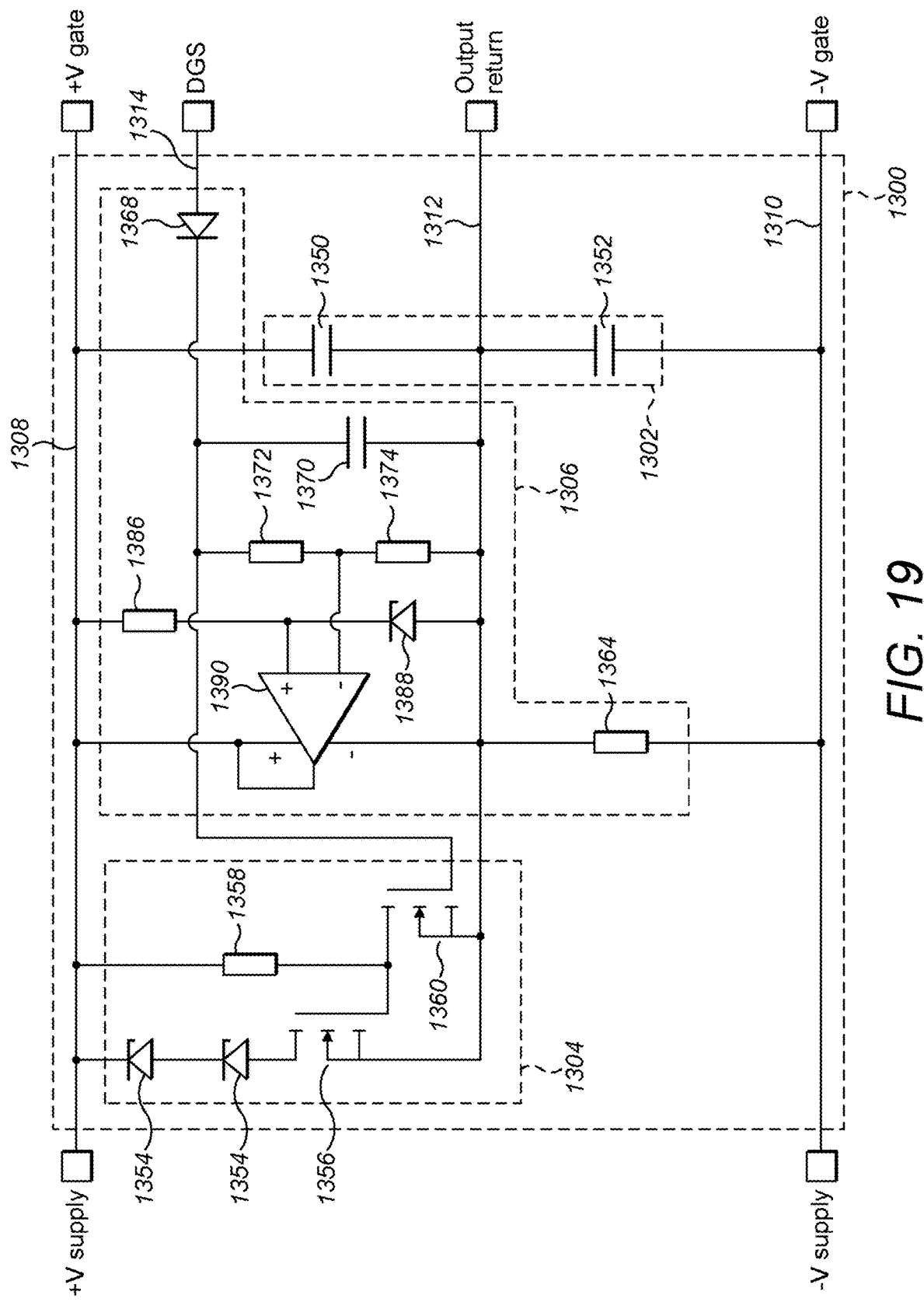
FIG. 19 shows a configuration of a power supply output device of the tenth preferred embodiment of the present invention.

FIG. 19 shows a tenth preferred embodiment of the power supply output device. The power supply output device 1300 of the tenth preferred embodiment differs from the power supply output device 500 of the second preferred embodiment through the removal of the reference diode 562 and third capacitor 566 of the second preferred embodiment. These components have been replaced in the tenth preferred embodiment with an operational amplifier (op amp) 1390, a Zener diode 1388, and a fifth resistor 1386. The power supply output device 1300 of FIG. 19 includes an upper supply rail 1308, a lower supply rail 1310, a voltage divider 1302, a voltage clamp 1304, and an adjusting circuit 1306.

The tenth preferred embodiment includes a first capacitor 1350, a second capacitor 1352, one or more Zener diodes 1354, a first switch 1356, a second switch 1360, a first resistor 1358, an op amp 1390, a second resistor 1364, a third capacitor 1370, a third resistor 1372, a fourth resistor 1374, a fifth resistor 1386, a Zener diode 1388, and a peak detector 1368.

The voltage clamp 1304 and the voltage divider 1302 in the tenth preferred embodiment are the same as in the second preferred embodiment.

In the adjusting circuit 1306, the positive power supply terminal of the op amp 1390 is connected to the upper supply rail 1308, and the negative power supply terminal of the op amp 1390 is connected to the output return line 1312. The output of the op amp 1390 is connected to the positive power supply rail of the op amp 1390. The fifth resistor 1386 is connected between the upper supply rail 1308 and the cathode of the Zener diode 1388. The anode of the Zener diode 1388 is connected to the output return line 1312. The non-inverting input of the op amp 1390 is connected to a point between the fifth resistor 1386 and the Zener diode 1388. The inverting input of the op amp 1390 is connected to the midpoint of the potential divider formed by the third resistor 1372 and the fourth resistor 1374.

The power supply output device 1300 of the tenth preferred embodiment operates in the same way as the power supply output device 500 of the second preferred embodiment up until the point when the voltage clamp 1304 is switched off. Namely, the second capacitor 1352 discharges through the second resistor 1364, causing the first capacitor 1350 to charge up until the voltage +V gate is clamped at the desired voltage to drive the power switch 308, in this case +6 V, by the voltage clamp 1304. The current through the fifth resistor 1386 and Zener diode 1388 is very low compared to the current through the second resistor 1364 so that the second capacitor 1352 discharges more rapidly than the first capacitor 1350, causing the first capacitor 1350 to charge up.

When a signal is input into the DGS line 1314, the voltage clamp 1304 is switched off, and the third capacitor 1370 is charged to the peak positive voltage of the signal V gate minus the voltage drop over the peak detector 1368. The Zener diode 1388 regulates at breakdown voltage of the Zener diode 1388, and therefore the non-inverting input of op amp 1390 is held at the breakdown voltage of the Zener diode 1388. The breakdown voltage of the Zener diode 1388 can be any value less than the voltage +V gate minus the loss over the peak detector 1368. The third and fourth resistors 1372, 1374 are then chosen so that the midpoint of the potential divider formed will be equal to the Zener diode breakdown voltage when the peak positive voltage of the signal V gate input into the DGS line 1314 is at the required voltage for driving the gate of the power switch 308. For example, if the peak positive voltage of the signal V gate is the desired voltage to drive the power switch 308, for example, at +6 V, and the loss over the peak detector 1368 is 0.6 V, the third capacitor 1370 will charge to +5.4 V, and the voltage across the potential divider of the third and fourth resistors 1372, 1374 will be +5.4 V. If the Zener diode 1388 is chosen with a breakdown voltage of +2.7 V, then third and fourth resistors 1372, 1374 with equal resistances are chosen, so that the midpoint will also be at +2.7 V when the peak positive voltage of the signal V gate is +6 V.

The midpoint of the potential divider defined by the third and the fourth resistors 1372, 1374 is connected to the inverting input of the op amp 1390. The op amp 1390 acts as a voltage comparator. When the voltage at the inverting input is higher than the voltage at the non-inverting input, the peak positive voltage of the signal V gate is higher than the voltage required for the power switch 308. In this case the output of the op amp 1390 is driven towards its negative power supply terminal voltage, the voltage of the output return line 1312. Because the output is connected to the positive power supply terminal of the op amp 1390, the op amp 1390 shunts current through to the negative power supply terminal. Therefore, the first capacitor 1350 discharges, causing the voltage +V gate to decrease.

On the other hand, when the voltage at the inverting input of the op amp 1390 is lower than the voltage at the non-inverting input the op amp 1390, the peak positive voltage of the signal V gate is lower than the voltage required for the power switch 308. In this case, the output of the op amp 1390 is driven towards the positive power supply voltage, i.e., the voltage of the upper supply rail 1308. As the output is already connected to the positive power supply terminal of the op amp 1390, no current is shunted by the op amp 1390. Therefore, the first capacitor 1350 charges up as the second capacitor discharges through the second resistor 1364, causing the voltage +V gate to increase.

When the inverting and non-inverting terminals reach an equal voltage, the circuit is balanced, with the voltage +V gate clamped at the voltage required of the power switch 308, for example +6 V, minus any losses in the gate driver circuit 306.

An example of the components used for the tenth preferred embodiment to maintain a positive gate voltage +V gate of +6 V from a 9–V supply from a DC-DC converter are first and second capacitors 1350, 1352 with a 4.7-µF capacitance, two BZX84-3V0 Zener diodes as the one or more Zener diodes 1354, two 2N7000 N channel MOSFETs as the first and second switches 1356, 1360, a 10-kΩ first resistor 1358, a TLC2272 as the op amp 1390, a 1-kΩ second resistor 1364, a 10-nF third capacitor 1370, a 54-kΩ third resistor 1372, a 27-kΩ fourth resistor 1374, a BZX84-2V7 Zener diode 1388, a 3.3-kΩ fifth resistor 1386, and a BAS70-06 diode as the peak detector 1068. Specific components and given values are exemplary only. Various alternatives could be used, as would be understood by those skilled in the art. For example, in an alternative preferred embodiment the Zener diode 1388 could be replaced with a reference diode.

The advantages of the tenth preferred embodiment are the same as the advantages of the previous preferred embodiments.

In the tenth preferred embodiment, the alterations, namely the use of the op amp 1388, the fifth resistor 1386, and the Zener diode 1388, have been made to the second preferred embodiment as an example. The alterations made in the tenth preferred embodiment could also be made to the fourth and sixth preferred embodiments. The alterations would be made in exactly the same way, by replacing the reference diode 762 or 962 and the third capacitor 766 or 966 with an op amp, resistor, and Zener diode, connected as in the tenth preferred embodiment.

The preferred embodiments of the present invention described above are not limited to power supplies for IGBT, SIC, MOS, and GaN power switches and may readily be used in other power switching technologies.

Examples physical values, including voltages, resistances, capacitances, breakdown voltages and the like, as well as examples of specific model numbers of components given throughout the preferred embodiments are exemplary only. Various alternatives could be used, as would be understood by those skilled in the art.

Although described separately, the features of the preferred embodiments outlined above may be combined in different ways where appropriate. It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

The invention claimed is:

1. A power supply output device for a DC-DC converter configured to provide a supply voltage, the power supply output device comprising:
   a supply input to receive a supply voltage from the DC-DC converter;
   a voltage divider to convert the supply voltage into a bipolar voltage output to be supplied to a gate driver circuit and including first and second output voltage values;
   a voltage clamp to initially set one of the first or the second output voltage values of the bipolar voltage output to a first predetermined voltage;
   an output to supply the bipolar voltage output to the gate driver circuit, the gate driver circuit being capable of outputting a drive output based on the bipolar output voltage to drive a gate of a switch; and
   an adjustment circuit to adjust the one of the first or the second output voltage values of the bipolar voltage output based on the drive output of the gate driver circuit to maintain the drive output of the gate driver circuit at a second predetermined voltage.

2. The power supply output device of claim 1, further comprising a direct gate sense input to receive the drive output of the gate driver circuit.

3. The power supply output device of claim 2, wherein the direct gate sense input is connected to the adjustment circuit.

4. The power supply output device of claim 2, further comprising an output return input to receive a feedback voltage signal from the switch driven by the gate driver circuit.

5. The power supply output device of claim 4, wherein the output return input is connected to an intermediate point of the voltage divider.

6. The power supply output device of claim 4, wherein the output return input is connected to the adjustment circuit.

7. The power supply output device of claim 4, wherein the supply input and the output to supply the bipolar voltage output include an upper supply rail and a lower supply rail, between which the voltage divider and the adjustment circuit are connected.

8. The power supply output device of claim 7, wherein the adjustment circuit includes:
   a peak detector to receive the drive output of the gate driver circuit and to output a signal based on a peak positive value of the drive output of the gate driver circuit.

9. The power supply output device of claim 8, wherein the peak detector includes one of a diode, a P-channel MOSFET, a Schottky diode, or a sample and hold circuit.

10. The power supply output device of claim 8, wherein the adjustment circuit further includes:
    a reference diode connected between the upper supply rail and the output return input;
    a first capacitor connected between a reference terminal of the reference diode and a cathode of the reference diode;
    a second capacitor connected between the output of the peak detector and the output return input;
    a first resistor connected between the output return input and the lower supply rail; and
    a potential divider connected between the output of the peak detector and the output return input; wherein
    the reference terminal of the reference diode is connected to a midpoint of the potential divider.

11. The power supply output device of claim 10, wherein the reference diode allows current to flow when the drive output of the gate driver circuit is above the second predetermined voltage.

12. The power supply output device of claim 10, wherein the reference diode defines the voltage clamp, and the adjustment circuit further includes a second resistor connected between the output of the peak detector and the upper supply rail.

13. The power supply output device of claim 8, wherein the adjustment circuit further includes:
   a first switch connected between the upper supply rail and the output return input;
   a capacitor connected between the output of the peak detector and the output return input;
   a first resistor connected between the output return input and the lower supply rail; and
   a Zener diode and a second resistor connected in series between the output of the peak detector and the output return input; wherein
   the first switch is connected to a point between the Zener diode and the second resistor.

14. The power supply output device of claim 13, wherein the first switch includes a transistor.

15. The power supply output device of claim 13, wherein the first switch switches on when the drive output of the gate driver circuit is above the second predetermined voltage.

16. The power supply output device of claim 13, wherein:
   the adjustment circuit further includes a third resistor connected between the output of the peak detector and the upper supply rail;
   the Zener diode, the second resistor, and the third resistor define the voltage clamp; and
   the first predetermined voltage is determined at least partially by a breakdown voltage of the Zener diode.

17. The power supply output device of claim 8, wherein the adjustment circuit further includes:
   an operational amplifier connected to the upper supply rail via a positive power supply terminal of the operational amplifier, and connected to the output return input via a negative power supply terminal of the operational amplifier;
   a capacitor connected between the output of the peak detector and the output return input;
   a first resistor connected between the output return input and the lower supply rail; and
   a Zener diode and a second resistor connected in series between the upper supply rail and the output return input; and
   a potential divider connected between the output of the peak detector and the output return input; wherein
   an inverting input of the operational amplifier is connected to a midpoint of the potential divider, a non-inverting input of the operational amplifier is connected to a point between the Zener diode and the second resistor, and an output of the operational amplifier is connected to the positive power supply terminal of the operational amplifier.

18. The power supply output device of claim 17, wherein the operational amplifier defines the voltage clamp, and the adjustment circuit further includes a third resistor connected between the output of the peak detector and the upper supply rail.

19. The power supply output device of claim 7, wherein the voltage clamp is connected between the output return input and the upper supply rail.

20. The power supply output device of claim 19, wherein the voltage clamp includes one or more Zener diodes, and the first predetermined voltage is determined by a breakdown voltage of the one or more Zener diodes.

21. The power supply output device of claim 20, wherein the voltage clamp further includes one or more switches to disconnect the one or more Zener diodes when a signal is received at the direct gate sense input.

22. The power supply output device of claim 21, wherein the first predetermined voltage and the second predetermined voltage are equal.

23. The power supply output device of claim 1, wherein the voltage divider includes a first capacitor and a second capacitor connected in series.

24. A DC-DC converter including the power supply output device of claim 1.

25. A power switch gate drive system comprising:
   a DC-DC converter;
   a gate driver circuit;
   a switch to receive an output of the gate driver circuit; and
   the power supply output device of claim 1.

* * * * *